(12) United States Patent
Verschuuren et al.

(10) Patent No.: US 9,440,254 B2
(45) Date of Patent: Sep. 13, 2016

(54) METHOD AND APPARATUS FOR APPLYING A SHEET TO A SUBSTRATE

(75) Inventors: Marcus Antonius Verschuuren, Eindhoven (NL); Mischa Megens, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1562 days.

(21) Appl. No.: 12/517,251

(22) PCT Filed: Dec. 3, 2007

(86) PCT No.: PCT/IB2007/054888
§ 371 (c)(1),
(2), (4) Date: Jun. 2, 2009

(87) PCT Pub. No.: WO2008/068701
PCT Pub. Date: Jun. 12, 2008

(65) Prior Publication Data
US 2010/0083855 A1 Apr. 8, 2010

(30) Foreign Application Priority Data
Dec. 4, 2006 (EP) .................... 06125296

(51) Int. Cl.
*G03F 7/00* (2006.01)
*B05D 1/28* (2006.01)
(Continued)

(52) U.S. Cl.
CPC .............. *B05D 1/28* (2013.01); *B05C 1/027* (2013.01); *B82Y 10/00* (2013.01); *B82Y 40/00* (2013.01); *G03F 7/0002* (2013.01)

(58) Field of Classification Search
CPC ........................ G03F 7/0002; G03F 7/0012
USPC .......... 101/483, 484; 399/303–305, 310, 314
See application file for complete search history.

(56) References Cited

U.S. PATENT DOCUMENTS

| 5,669,303 A | 9/1997 | Maracas et al. |
| 6,025,860 A * | 2/2000 | Rosenfeld et al. ........... 347/171 |

(Continued)

FOREIGN PATENT DOCUMENTS

| EP | 0794016 A1 | 9/1997 |
| WO | 03099463 A2 | 12/2003 |

(Continued)

OTHER PUBLICATIONS

Marzolin et al: "Fabrication of Glass Microstructures by Micro-Molding of SOL-GEL Precursors"; Advanced Materials, 1998, vol. 10, No. 8, pp. 571-574.

(Continued)

*Primary Examiner* — David Banh
(74) *Attorney, Agent, or Firm* — Larry Liberchuk

(57) ABSTRACT

The invention provides a method and apparatus for laminating a sheet to a substrate in a stress free and distortionless manner. The method comprises providing the sheet and substrate such that an attractive force between them exists that is capable of bringing the sheet and surface together at least when their distance is shorter than a critical distance. The method creates these conditions by locally making an initial contact between the sheet and substrate such that at a contact front, being the boundary between areas where the substrate and sheet are in contact and those where they are not in contact, these conditions exist. In a further step the sheet and substrate are allowed to gradually make contact such that the contact front advances along either of the substrate or sheet surface therewith increasing the contacting area between the substrate and the sheet. The method is advantages when used during imprint lithography or embossing processes or other processes where feature patterns need to be transferred from the substrate to the surface or vice versa.

24 Claims, 14 Drawing Sheets

(51) Int. Cl.
*B05C 1/02* (2006.01)
*B82Y 10/00* (2011.01)
*B82Y 40/00* (2011.01)

(56) References Cited

U.S. PATENT DOCUMENTS

| | | | |
|---|---|---|---|
| 6,792,856 B2* | 9/2004 | Hall et al. | 101/368 |
| 7,665,399 B2* | 2/2010 | Biggs et al. | 101/28 |
| 7,691,313 B2* | 4/2010 | Choi et al. | 264/299 |
| 2004/0029382 A1* | 2/2004 | Kawase | 438/689 |
| 2004/0090611 A1* | 5/2004 | Choi et al. | 355/75 |
| 2004/0197712 A1 | 10/2004 | Jacobson et al. | |
| 2004/0261981 A1 | 12/2004 | McCoy et al. | |
| 2004/0264019 A1 | 12/2004 | Curtiss et al. | |
| 2005/0087911 A1 | 4/2005 | Ford | |
| 2005/0230882 A1 | 10/2005 | Watts et al. | |
| 2007/0114686 A1* | 5/2007 | Choi et al. | 264/2.7 |
| 2008/0202365 A1* | 8/2008 | Schneider et al. | 101/287 |
| 2008/0271625 A1* | 11/2008 | Chauhan et al. | 101/253 |

FOREIGN PATENT DOCUMENTS

| | | |
|---|---|---|
| WO | 2005101466 A2 | 10/2005 |
| WO | 2006043244 A1 | 4/2006 |
| WO | 2006117745 A1 | 11/2006 |
| WO | 2008053418 A2 | 5/2008 |

OTHER PUBLICATIONS

Wolf et al: "Silicon Processing for the VLSI ERA—vol. 1—Process Technology"; Lattice Press, 1990, Chapter 12.

* cited by examiner

METHOD AND APPARATUS FOR APPLYING A SHEET TO A SUBSTRATE

FIELD OF THE INVENTION

The invention relates to a method for establishing contact between a first surface of a substrate and a second surface of a sheet. The invention also relates to a method for transferring a template pattern from the flexible sheet to the substrate using the method for establishing contact. The invention further relates to an apparatus for carrying out either of the methods.

BACKGROUND OF THE INVENTION

U.S. Pat. No. 5,669,303 discloses an apparatus for micro contact printing including a support structure, a flexible stamp having a stamping surface including a predetermined pattern disposed opposite the support structure, a pressure controlled chamber disposed above the support structure, and a mechanical attachment affixed to the flexible stamp. Furthermore, U.S. Pat. No. 5,669,303 discloses a method for micro contact printing. In the method, contact between a wetted stamping surface of a flexible stamp and the surface of an article is obtained by changing the pressure differential across the flexible stamp so that contact commences at the center of the flexible stamp and proceeds outwardly in a controlled way.

U.S. Pat. No. 5,669,303 relates to gradual establishment of contact between a flexible stamp and the substrate in order to avoid air inclusions between the stamp and the substrate. However, with the known methods and apparatuses the pattern gets distorted, since the stamp contacts the substrate in a deformed and stretched state.

U.S. Pat. No. 5,669,303 addresses the problem of a distortion of the pattern. In particular, it is noted that due to the elasticity and/or local strain of the flexible stamp, runout or a local deformation of the pattern may occur. A solution is found in compressing or stretching the flexible stamp at the appropriate locations, wherein mechanical attachments are provided with the appropriate detection and control elements to provide this correction when required. All in all, this solution requires a complicated correction system, and is far from practical.

The method and apparatus according to the invention constitute a major difference with respect to those of U.S. Pat. No. 5,669,303. While in the known method and apparatus the flexible sheet is pressed against the substrate, wherein stress is induced in the flexible sheet by the external pressing force, this is deliberately not done in the method and apparatus of the present invention.

SUMMARY OF THE INVENTION

It is an object of the invention to provide a method for establishing contact between a sheet and a substrate without deforming the sheet and therewith a possible pattern if present on the sheet.

The invention is defined by the independent claims. The dependent claims define advantageous embodiments.

In a first aspect the object of the invention is achieved by providing a method for establishing contact between a first surface of a substrate and a second surface of a sheet;
the method comprising the steps of:
providing the substrate and the sheet;
providing a force producing means that results in an attractive force between the substrate and the sheet, the attractive force being able to bring at least part of the first surface and the second surface towards each other when a first distance between the first surface and the second surface is smaller than a threshold distance;
establishing initial contact between the first surface and a first area of the second surface while preventing the establishment of a further contact between the first surface and a second area of the second surface, whereby the first area and the second area are separated by a contact front and thereby creating the first distance;
establishing a further contact by allowing the contact front to advance along the first surface in the direction of the second area such that the advancement is determined by the attractive force.

The term sheet in the context of the invention must be construed as being an object having material properties and geometric dimensions such that it is flexible or deformable to at least some extent. Flexible in the context of the invention means repeatedly bendable or deformable without being damaged substantially.

The term substrate is meant to include all substrates conceivable being flexible or stiff and is not meant to distinguish between objects being flexible or not.

The force producing means are provided such that the resulting attractive force operates between the substrate and the sheet. The attractive force is large enough for bringing the substrate and the second area of the second surface closer together at least when the distance between these surfaces becomes smaller than a threshold distance. Thus, although the attractive force may operate at a certain point in time during the method, it may at that point not have the effect of displacing either or both of the substrate and the sheet. Nevertheless, at least when a distance between the first surface and the second surface has been reduced below the threshold distance the attractive force operating at the position where that distance is measured will the attractive force reduce this distance.

The force producing means can have a plurality of origins including molecular forces such as van der Waals forces, dipolar forces or ionic forces, (electro)magnetic forces and the like. Within the context of the invention, the strength of the force can be adjusted or provided according to the mass of the parts of the substrate and or sheet that need to be displaced. Alternatively, when the force producing means provide an attractive force that is substantially non-adjustable, the mass can be adapted to the force in order to fulfill the requirement according to the invention.

Initial contact is established only between a first area of the sheet and the first surface of the substrate, while at the same time a second area of the sheet which abuts the first area is kept or prevented form making contact with the first surface. In this stage the term 'preventing' is used to indicate that it is sufficient for the invention to establish the first contact such that the second area is merely not made to contact the first surface. The result of the step is that the first area is separated from the second area by a border line running along the first surface, which border line defines a contact front. The shape or curvature of this border line or contact front depends on the way the first contact area is defined. Multiple contact fronts may be present or a contact front may form a closed loop for example.

The invention is then based on the further insight that in a certain small area on either side of the contact front their will exists a distance between the first and second surface that is smaller than the threshold distance for a given attractive force and mass to be displaced. Thus, according to the invention the attractive force is provided just large enough to move the first surface and the second surface closer together at least when the distance between the first surface and the second surface is very small, i.e. the force is provided such that it will be effective in displacing the first surface and the second surface towards each other at least beyond a small threshold distance or differently stated at least in the vicinity of the contact front. Therewith, the invention provides displacement of sheet and or substrate using small forces.

An advantage is that shear components of these small forces, which are responsible for introducing stress within the substrate and/or sheet along the surfaces near the contact front, are thus small. Therewith distortion of the flexible sheet in the vicinity of the contact front is also minimized. Hence, at the moment of the actual establishment of the contact at the position of the contact front during the establishment of further contact, the sheet is substantially free of distortion with respect to its equilibrium state and therewith free of stress and deformation.

According to the method, during the establishment of further contact, the contact front advances along the first surface in the direction of the second area. The attachment proceeds such that behind the contact front first area is created at the expense of second area ahead of the contact front. Therewith, the sheet and substrate are allowed to gradually attach themselves to each other as determined by the attractive force.

It is an advantage of the method that the contact front advances and the contact between the second area and the first surface is established without having to provide an advancing force in the advancing direction. This is in shear contrast with methods of the prior art such as those disclosed within U.S. Pat. No. 5,669,303 and US 2004/0197712 where a pressing member is displaced along the flexible sheet in order to move the contact front, therewith introducing strong shear forces.

It is a further advantage of the method that the establishment of further contact by the advancing contact front reduces air inclusion between the first surface and the second area of the second surface. Therewith, stress and deformation due to such air inclusions is avoided.

It is yet another advantage of the method that the first surface and the second surface do not need to be flat. Shape conformal establishment of contact in a stress free state is enabled by the invention. The sheet can be attached to a first surface that is curved or comprises irregularities whereby the sheet (and/or the substrate if that is flexible) conforms to the curvature or irregularities within the limits of flexibility (bending or deformation) of the sheet and/or the substrate. The advantageous will be apparent to the skilled person when for example, in semiconductor industry wafers are not perfectly flat due to heat treatment. The non-flatness is conveniently dealt with by the method according to the invention.

It is another advantage of the method that it does not depend on the force of gravity. In free space where the force of gravity is reduced and in situations where the first surface and the second surface are oriented such that during establishment of further contact the direction of motion of the first surface and the second surface towards each other is perpendicular to the direction of the force of gravity, the method of the invention still works. Moreover, the method works in situations where the force of gravity works against this direction of motion.

In an embodiment the attractive force is a surface force operating between the first surface and the second surface. The attractive force may include components classified as a body (volume) force or a surface force. While body forces such as for example gravity and certain electromagnetic forces slowly decrease with increasing distance between the objects (bodies) attracted, surface forces show a strong decrease. Surface forces include those of direct molecular origin such as the van der Waals forces or dipolar forces. They are significant when the distance between bodies is very small, i.e. when the threshold distance is very small. These forces are so small that they are of comparable strength as the interatomic or intermolecular forces (Van der Waals forces, dipolar forces or ionic forces) operative within a material which provide the shape integrity of for example the sheet and/or the substrate. Hence, establishment of contact using such forces is advantageous in terms of force control.

Another advantage is that the surface forces operate only on the surface and not on the body of sheet and/or substrate. Squeezing of surface details and their consequent deformation, which may occur by body forces is therewith reduces or prevented this may be particularly important when the first or second surface comprises relief features.

Furthermore, the strength of surface forces may be advantageously tailored by for example chemical or physical surface modification. Layers of materials as thin as mono layers of surfactants may be used to accomplish this. The mono layers can be used to alter the surface properties from hydrophilic to hydrophobic using standard techniques known in the art.

In an embodiment, before establishing further contact, at least one of the substrate and the sheet comprises a fluid such that a part of at least one of the first surface and the second surface is being provided by the fluid. The result of this embodiment is that after establishment of further contact the fluid is present in between at least part of the first surface and the second area of the second surface. The force is due to adhesive properties between fluid and first surface and/or between fluid and second surface. The fluid advantageously allows that possible shear forces, stress or pressure differences accumulated during the process of establishment of further contact to be reduced or removed as a consequence of its hydrodynamic properties. Thus, while contact has been established, fluid flow helps to reduce possible imperfections.

In an embodiment, the fluid forms a contact angle of at most 90 degrees with at least one of the first surface and the second surface. If a fluid forms a contact angle smaller than 90 degrees with a surface, it has the propensity to wet that surface and hence to spread over the surface. Hence, the fluid need not be present over the entire second area just before or during the establishment of further contact. Furthermore, the attractive forces operating comprise a component of surface forces due to surface tension. Capillary effects may act as attractive forces. The first and/or second surface then may be provided with capillaries relief surface to effectuate the advancement of the contact front. The wetting properties of the fluid may be altered using surface active materials such as surfactants. These may be applied to the fluid, but also to the first surface and or the second surface. This is advantageous in that when a first surface, a fluid and a second surface are not intrinsically compatible resulting in the required 90 contact angle, the modification may be used to provide this contact angle without having to alter the fluid and/or the first surface and/or the second surface entirely. Therewith a much broader applicability of the method is provided In an embodiment, the initial contact is established such that at least two independent contact fronts are formed and that during the establishment of further contact both contact fronts advance. Multiple contact fronts advancing independently reduce the time necessary to establish further contact. Furthermore, if irregularities during the establishment of further contact accumulate over the distance that further contact needs to be established, reducing the distance will reduce also the extent to which such irregularities appear. Note that having at least two independent contact fronts implies that at least two independent second areas exist also.

In an embodiment, preventing the second area from making contact with the substrate surface comprises restraining at least a part of the second area from making contact with the first surface, therewith preventing the contact front to advance after establishing initial contact, and releasing a portion of the restrained part of the second area to allow the contact front to advance. In this embodiment, the advancement of the contact front after establishment of the initial contact is in first instance prevented by restraining at least a part of the second area such that further contact can not be established. It is only after releasing of a portion of the restrained second area that the contact front advances over a certain distance. The advancement can continue up to the point that it is again prevented by the remaining restrained part of the second area. Then a next portion of this restrained area can be released to continue the process of establishing further contact. Alternatively, further portions are released such that advancement may continue undisturbed. Although it may seem that in this process stress is introduced during establishment of further contact, this is not the case. The reason for that is that before the establishment of further contact through the advancing contact front, a portion of the restrained sheet is released enabling this portion to relax. The relaxation in turn enables the further establishment of contact and hence advancement of the contact front under stress free conditions.

One advantage of this embodiment is that it can be used in situations where orientation of the various parts (substrate and sheet) and gravity would otherwise disturb the process. Thus, for example, if one of the first or second surfaces is sticky, it is preferably not oriented such that dust will fall on top due to gravity, rendering the surface a dust collector. The sticky surface may be advantageously positioned with its sticky surface facing downward without falling on top of the surface it needs to be attached to. Furthermore, the portion of the restrained part of the second area which is released but not attached to the first surface yet, i.e. the portion which is actually free to move during establishing of further contact, may be chosen at will. This is advantageous since controlling the mass and stability of this free portion reduces the sensitivity of the method towards external circumstance such as for example vibrations or air convection. Also, as stated earlier, the attractive force must be able to displace the free mass. Control over the mass provides design freedom and optimization with respect to the attractive force and therewith also the advancement rate for the method.

Alternatively, the restrained part of the sheet may be kept in a stress-free state in a fixed position having a shape that corresponds to the shape of the surface it needs to be contacted to.

In an embodiment the contact front advances with an advancement rate and the second area is released with a release rate, the release rate being smaller than the advancement rate. The advancement rate is defined as the distance over which the contact front advances per unit time, for example in the direction substantially perpendicular to the contact front. The release rate is the amount (or length) of second area of the sheet released per unit time in the direction same direction as the advancement rate is measured, e.g. the direction substantially perpendicular to the contact front. The advancement rate of the contact front is dependent on the properties of the sheet and the substrate (for example first and second surface as well as bulk properties of the sheet and/or surface such as stiffness) and the force. Hence the advancement rate is in many cases given by the system at hand and not amenable to external control. In contrast the release rate can be controlled. This is for example advantageous when the advancement rate is not constant along the contact front, since then the contact front will change its shape, e.g. it will become curved if it was linear at the start. Consequently, the sheet may become deformed and therewith stress may be introduced in the sheet during the establishment of further contact. By using a release rate smaller than the highest advancement rate, the curving can be counteracted or even prevented. In effect, the fastest advancing regions of the contact front are slowed down to the release rate. The release rate is controllable and can be adjusted according to need. Thus, the curvature of contact front may be prevented by adjusting the release rate to a value of at most the smallest advancement rate. Hence, in this way the process of establishing further contact may be controlled accurately to provide the contact without introducing stress when the nature or properties of the first surface and/or the second surface are not constant over these surfaces such that they result in an advancement rate that varies over the surfaces and along the contact front.

This embodiment prevents that the free part of the sheet becomes larger with progressing of the establishment of further contact. Therewith the formation of air inclusions due to premature contact between the first surface and the second surface ahead of the advancing contact front is prevented.

Alternatively, the contact front can be steered by the control of the release rate according to the same principle.

In an embodiment the advancement rate is measured and the result is used to set a release rate. As described for the previous embodiment, the advancement rate is in many cases a property that is dependent on the system at hand. Although it can be influenced by design or choice of amongst others the properties of the first and second surfaces to be contacted. It will generally be difficult to predict the advancement rate based on such properties. In the present embodiment that prediction is advantageously rendered unnecessary by measuring the advancement rate. This can be done for example in a test run. Once the advancement rate is known, the release rate can be adjusted or set according to desire and the known advancement rate, without having to know all the details of the system determining the advancement rate. This offers flexibility in applicability of the method as well as speed.

In an embodiment, during establishment of further contact, an advancement rate value is measured at least once and the measured advancement rate value is used to adjust the release rate. Although in theory the advancement rate can be influenced by controlling the properties of the system at hand, from a practical viewpoint this will be a difficult task. It will be even more difficult and sometimes impossible to arrange the system such that the advancement rate is known and substantially constant over a surface that needs to be contacted. In the present embodiment that task is advantageously rendered unnecessary by actual measurement of the advancement rate during the establishment of further contact. Hence, actual advancement rates are used to adjust the release rate such that establishment of further contact proceeds with a minimum of distortion. This embodiment is therewith particularly advantageous when the surfaces to be contacted have vastly differing properties over the surface, or when the stiffness of the sheet is not uniform due to for example thickness or other dimensional variations.

In an embodiment, the sheet comprises a template pattern for transferring to the substrate. The method according to the invention can be advantageously used for transferring patterns to a substrate as is done in for example printing processes such as micro contact printing, embossing or imprint lithography as well as in lithographic processes. The method for establishing contact according to the invention is particularly advantageous when the sheet and/or surface comprises vulnerable features. Vulnerable features are for example present in the patterns having small dimension as used in the transferring processes. The method according to the invention then provides the opportunity to establish the contact such that these features are substantially not deformed such that they may be reproduced adequately when contact has been established. Preferably the pattern or features to be reproduced are then present in the second area, since this is the part of the second surface with which further contact is established. In addition, such and other features may be transferred over large area in one patterning run, where large areas are for example areas larger than 4 cm². No stitching of multiple neighboring sequentially applied small area patterns is needed.

In an embodiment the template pattern is transferred to the substrate using a photolithographic process. In for example semiconductor industry it is common practice to pattern material layers of a substrate using lithography such as photolithography for device fabrication. In such a photolithography process the template pattern is used as a mask to pattern the layers. Detailed description of such processes can be found in numerous handbooks such as for example Silicon processing for the VLSI Era volumes 1 (1990 Lattice Press, ISBN 0-961672-4-5 and 2 (2000 ISBN 0-9616721-6-1). See for example chapters on lithography for information and definition of terms used within the present invention. In a usual process flow for lithography the layer to be patterned is a so called photoresist which is sensitive towards radiation provided through illumination according to the mask pattern and which after illumination can be developed such as to represent the template pattern. In a number of such processes phase shift masking is used. It is preferred with respect to optical requirements of influence to adequate pattern reproduction that a mask is close to the layer to be patterned. The invention advantageously enables to provide a mask in the form of a sheet directly on top of the layer and conformal to the shape of layer surface. Hence, also substrates having non-flat surfaces as a consequence of for example previous patterning can be conveniently provided with such a masks therewith improving pattern reproduction upon such surfaces.

The layers to be patterned may be the photoresists themselves, but also the device layers or hardmask layers.

In an embodiment, the sheet comprises a relief surface representing the template pattern. The reproduction of a template pattern in a surface of a substrate can be done using a relief surface that is employed as a stamp in a printing process. Well known printing processes are imprint lithography processes or embossing processes. The relief of the template pattern within the sheet is used to provide (masking) material according to the pattern represented by the relief for use in for example lithography processes such as described in the previous embodiment. In an embossing process according to the invention the sheet is contacted with a substrate such that the template pattern is embossed in a liquid or formable layer. The liquid is subsequently hardened using for example an exposure or curing process, such that after removal of the template pattern the complementary pattern remains within the embossed layer being part of the substrate. Advantageously, in such a process the embossed liquid may serve both the purpose of being the to be patterned layer and the layer that provides the attractive force according to the invention. The liquid can be specifically adapted to be optimized for either of the functions or both. In addition, the hydrodynamic properties of the liquid layer enable that the template relief pattern may adjust itself to its stress free equilibrium configuration after the further contact has been established therewith reducing distortions further. Hence, a wide range of relief shapes (high aspect ratio, small aspect ratio or in between) can be printed accurately over large area. The flexibility of the sheet provides the opportunity to pattern surfaces that are not flat. In an embodiment after transferring of the template pattern to the substrate, the template pattern is detached from the substrate. Usually the mask, i.e. the sheet is removed after patterning so that a next layer can be patterned using a different mask if preferred.

The present invention further relates to an apparatus for carrying out the method of claim 1, the apparatus comprising:

a first holder for holding the substrate;
a second holder for holding at least a first part of the first area of the flexible sheet;
contacting means for establishing the initial contact;

In an embodiment an apparatus is further conceived for carrying out the method of claim 7, the apparatus further comprising controlling means for controlling the advancement rate.

As stated here before, the advancement rate is determined by the properties of the system at hand. The attractive force is for example dependent on temperature. By altering the temperature using temperature controlling means, the advancement rate can be set to a desired value.

In an embodiment, the controlling means comprise restraining and releasing means for restraining and releasing at least a part of the second area of the second surface. The releasing means and restraining means advantageously allow to control the release rate. This in turn provides accurate control over stress and deformation during further contact establishment as described here before with regard to the method. Preferably the control of restraining and release means comprise actuators that operate in a contact less manner in order not to induce stress. Suitable actuators are (electro)magnetic units. Alternatively, nozzles for providing vacuum and an overpressure can be used. This has the advantage that the sheet o=r the substrate on which the actuators need to operate do not have to made of material that allow (electro)magnetic holding to be used. The actuators may be dispersed over the first area each of them acting on a different area of the sheet or substrate such that at least the entire relevant area can be controlled during the establishment of further contact.

In an embodiment, the controlling means further comprise measuring means for measuring the advancement rate. Measuring the advancement rate makes a priori determination of advancement rate based on the properties of the system not necessary. A simple test will provide the data needed. The measuring means may include mechanical sensors (pressure), (electro)magnetic sensors (capacitive and/or inductive), electromechanical sensors (piezoelectric) or optical sensors (led or charge coupled devices).

In an embodiment, the controlling means further comprise a regulating unit, the regulating unit being capable of adjusting the release rate according to a measured advancement rate. For automated process execution as well as increased precision with respect to stress and deformation control, the advancement of the contact front is measured during the establishment of further contact and the results obtained are directly fed into the regulating unit which adapts or adjusts the release rate according to the actual advancement rate. Preferably, there is provided also a user input option to set boundary values for the process. Hence, when the advancement rate for some reason (such as inequality of surface properties of the first and/or second surface) alters during the establishment of further contact, the release rate is altered accordingly to guarantee optimum control during the process.

In an embodiment, the restraining and releasing means include a plurality of spaced apart devices, each device being capable of restraining and releasing a portion of the second area of the sheet, the largest distance between two neighboring spaced apart devices being at most 5 mm. If during the establishment of further contact the amount of sheet released per operated actuator is larger than 5 mm, the process is difficult to control. Premature contact ahead of the advancing contact front is likely to occur due to vibration of the relatively large free part of the released sheet. Preferably, in order to avoid air inclusions between the sheet and the substrate, a distance between successive devices or actuators is even no longer than 2.5 mm. This is particularly true in case the actuators are pneumatic actuators.

US 2004/0197712 discloses a contact printing system having a flexible stamp which is formed around support material, wherein the support material is attached to a spring, and wherein both the stamp and the support material are pulled tight by the spring. A substrate is positioned beneath the stamp by a translation stage and held by a vacuum chuck. For the purpose of bringing the stamp into contact with the substrate, a roller is rolled along the stamp. Padding material on the roller is used to control the contact pressure.

An apparatus comprising a plurality of actuators in a process of micro contact printing is known from WO 2003/099463. However, according to the known method, the actuators are used for the purpose of exerting pressing forces on portions of a stamp in order to successively move portions of the stamp towards a substrate. Hence, it is not a matter of gradually releasing the stamp in order to let the stamp attach itself to the substrate.

BRIEF DESCRIPTION OF THE DRAWINGS

The present invention will now be explained in greater detail with reference to the figures, in which equal or similar parts are indicated by the same reference signs, and in which.

Figure 1A:
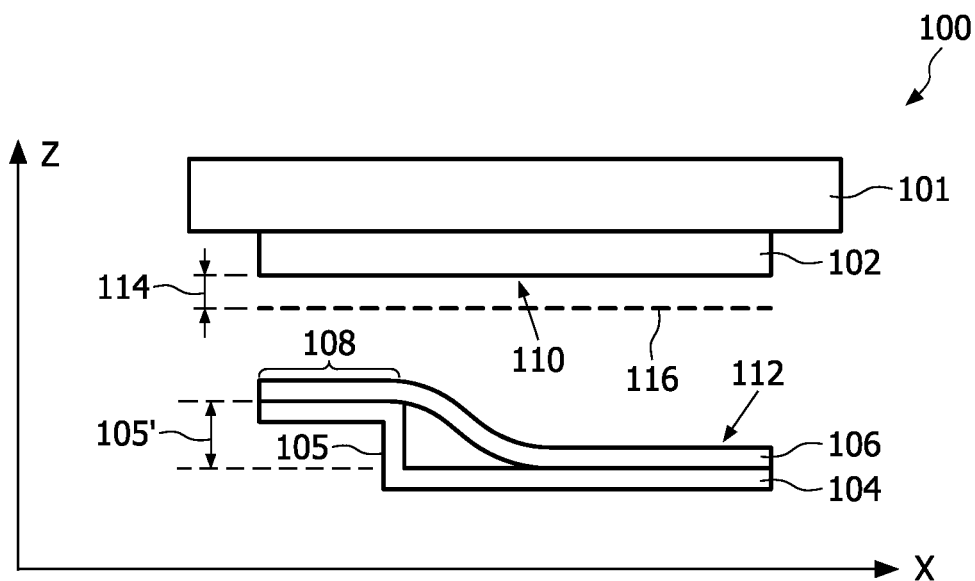
FIG. 1A to 1F diagrammatically show sectional views not drawn to scale of different stages of a method according to the invention using an apparatus according to the invention.

The figures are not drawn to scale and represent schematic situations.

DETAILED DESCRIPTION OF THE INVENTION

The method and apparatus according to the invention are elucidated by the embodiments described below. Although the embodiments can be construed as individual implementations of the invention, advantageous features of one embodiment may be used in others where appropriate and possible. For example a number features for treating or providing substrates and/or sheets may be used in the different apparatuses of the embodiments.

A first embodiment of an apparatus and method according to the invention is described with reference to FIGS. 1A to 1F. The apparatus comprises a first holder 101 holding a substrate 102 for example by creating a vacuum in between the first holder 101 and the substrate 102 using vacuum nozzles (not shown) present in the first holder to create an under-pressure between the first holder and the substrate. This is for example common practice in semiconductor industry for handling and holding semiconductor wafers. Other mechanisms for holding the substrate using mechanical clamping or electromechanical attachment may be alternatively used.

The apparatus further comprises a second holder 104 having a shape such that it comprises a step 105 with a height 105'. The second holder 104 sustains a sheet 106, whereby in this embodiment the holder holds a first area 108 of the sheet firmly in for example the same manner as the substrate is held by the first holder. The sheet 106 is slightly bent due to the step 105 in the second holder 104, so that in this embodiment outside the first area the sheet is at least partly sustained by the second holder 104. The part of the sheet spanning the distance from the step to the lower part of the second holder in this embodiment is designated the free part of the sheet.

The second and first holder are part of an apparatus which is not shown as a whole in the figures. The apparatus is further adapted for executing the method described here below in a proper manner. To this end, the apparatus further comprises means for positioning and repositioning the first holder 101 relative to the second holder 104 and sheet 106 in three dimensions represented by the three Cartesian coordinates X, Y, Z. Furthermore there may be provided means for adjusting the relative positions laterally (in a direction in which the first surface and/or second surface extend), vertically (in a direction perpendicular to the lateral direction) both using translation and orientation. In this example the apparatus includes the means for manual displacement. However, automated displacement such as for example described with respect to the embodiments described hereafter may be alternatively provided and is preferred in view of improved precision and speed of the control, as well as in view of automated use within production lines. The automated displacement may thus include controlling means such as for example mechanical or electrical units providing mechanical or electrical feedback mechanisms for precisely controlling the relative XYZ positions and orientation of the first surface 110 and the first area 108 of the second surface 112. These means may also comprise those for measuring and controlling contact pressure in view of the state of the sheet and/or substrate (amount of deformation or stress of the sheet and/or substrate during execution of the method.

The substrate 102 has a first surface 110 facing a second surface 112 of the sheet 106. In this embodiment the substrate 102 and sheet 106 are positioned substantially parallel with respect to each other. Other relative orientations are possible. The second surface 112 extends at a first distance from the first surface 110, which first distance is larger than a threshold distance 114 represented by the dashed line 116. The threshold distance is determined by the system and attractive force in question, as will be described below.

In this embodiment, the substrate surface has been provided with charge using methods known in the art such as for example corona spraying or treatment with a carbon brush as is common in copying machines. The charge provides an electrical field responsible for an attractive force between the substrate 102 and the sheet 104. Other ways of providing attractive forces that can be used within this embodiment will be described with respect to the other embodiments within this application.

In a next step, initial contact is established between the first area 108 of the second surface 112 of the sheet 106 and the first surface 110 of the substrate 102. To this end, in this embodiment the second holder 104 is moved in the Z-direction, after having adjusted the lateral position and relative orientation of the second surface relative to the first surface 110 using the means described here before.

Figure 1B:
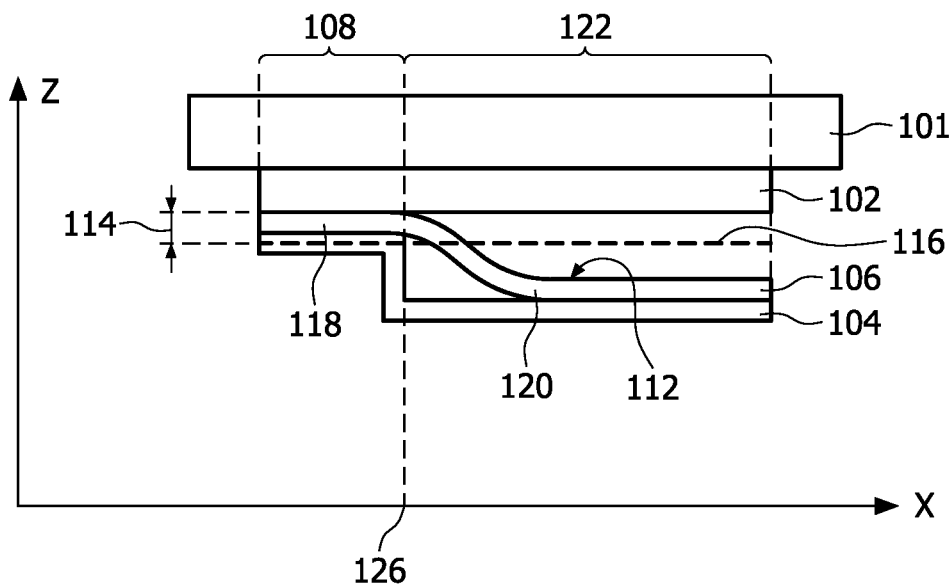
Figure 1C:
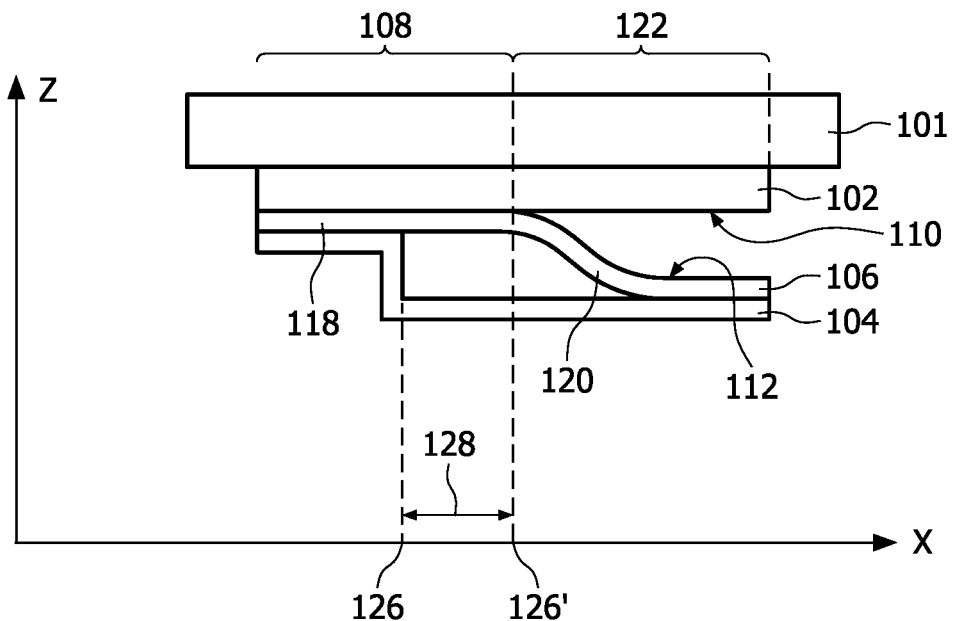
Figure 1D:
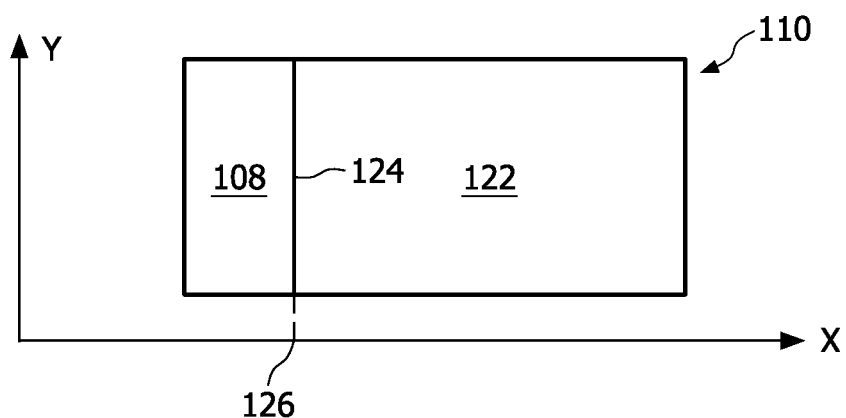

The immediate result is shown in FIGS. 1B and 1D. FIG. 1D represents a plan view of the first surface 110 wherein the projections of the first and second areas of the sheet 106 are shown. Due to the establishment of the initial contact, the sheet 106 is divided in an attached part 118 of which the first area 108 is in contact with the first surface 110 and a part 120 having a second area 122 which is not in contact with the first surface 110. The boundary line between the first area 108 and the second area 122 defines a contact front 124 at X-position 126. The contact front 124 runs along the surface 110.

The initial contact has created a condition such that there now exists a region in which the first distance is shorter than the threshold distance 114. Therewith, the steps of providing the attractive force combined with the establishment of initial contact creates the conditions for establishing a further contact. This is further detailed with reference to FIG. 1F. In the vicinity of the contact front 124, to the right of X-position 126, there exists a region where the second surface 112 of the second area 122 of the sheet 106 is closer to the first surface 110 of the substrate 102 than the threshold distance 114 indicated by the dashed line 116. Therefore, within this region, the attractive force creates a force balance that enables that a part of the free part 120 of the sheet 106 is displaced towards the first surface 110, thereby establishing further contact between a part of the second area 122 of the sheet 106 and the first area 110 of the substrate 102 just near the contact front 124 to the right of the X-position 126. This effectively causes the contact front 124 to shift to the right with respect to position 126. The process then repeats itself in a continuous manner and therewith causes that the contact front 124 advances along the first surface 110 in the direction of the second area 122, therewith establishing a further contact in a gradual way.

Figure 1E:
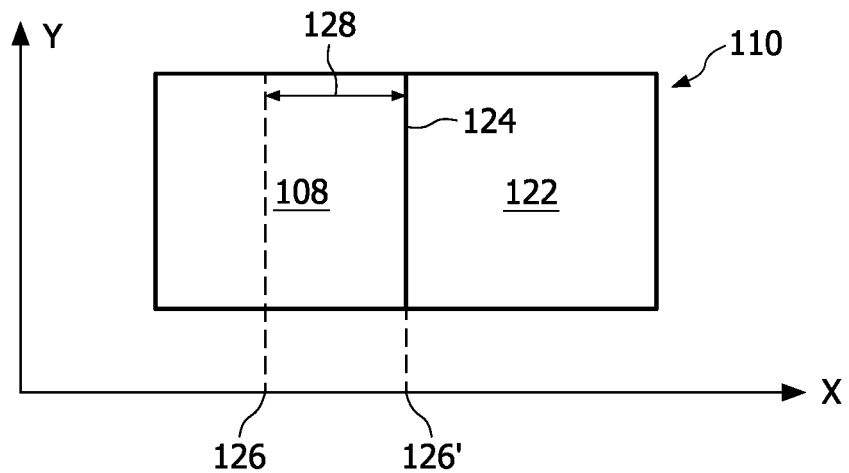
Figure 1F:
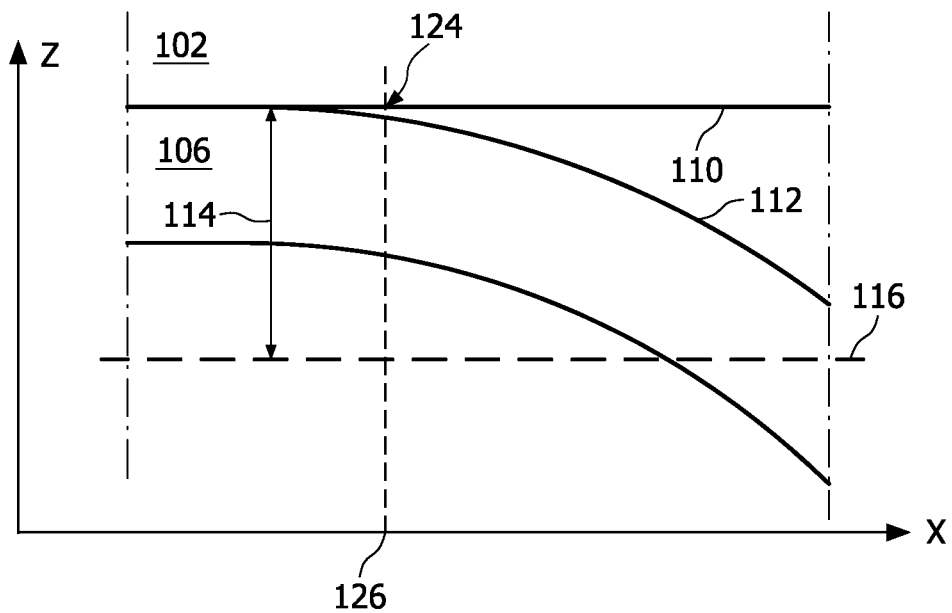

After some time Δt of establishing further contact, Δt being measured from the time of establishment of the initial contact, the contact front 124 will have advanced over a distance 128 in the X-direction towards new X-position 126' as depicted in FIGS. 1C and 1E. The further contact between the second area 122 and the substrate is gradually established in a process wherein the first area 108 is created just behind the advancing contact front 124 at the expense of the second area 122 ahead of the contact front 124.

By performing the method with an apparatus according to the invention, the second area 122 of the sheet 106, is applied to the first surface 110 with minimal stress and distortion. This is due to the condition that the contact between the first surface 110 and the second area 126 is always formed just near the contact front 124, which is at the location where the sheet 106 has minimal deformation. The extent of deformation is dependent on the ratio between deformation in the Z-direction with respect to the X-distance over which this deformation in the Z-direction occurs, i.e. curvature. Similar ratios will apply in other directions. Thus, with respect to small scale, e.g. smaller than micrometer scale, the deformation will be relatively small when curvature occurs over a distance of millimeter X-distance and tens of microns in the Z-direction. Hence at the contact front bending is almost absent at such small scales and the sheet contacts in virtually stress-free state. Moreover, the further contact is established under conditions where the attractive forces are relatively small. The charge applied is carefully regulated in order to adjust the forces to appropriate strength with respect to the necessary force balance. The forces preferably are of the scale of molecular forces or the forces providing the sheet materials shape and structure integrity such as ionic, dipolar or van der Waals forces. If that is the case, the forces resulting in local deformation such as for example shear forces (operating in the plane of the sheet) that arise due to for example projections of the attractive force along the sheet surface are of the same scale and smaller than the forces necessary to provide structural and shape integrity of the material. This reduces the deformation considerably.

In an embodiment, the second holder 106 is provided in such a way that the area 108 as well as the step height of the step 105 can be altered independently. Therewith not only the size and shape of the first area and thus the initial contact can be chosen according to desire, but also the curvature, or deformation of the sheet near the step of the second holder can be controlled, within the boundaries determined by the flexibility of the sheet. Within the application flexibility is defined as the capability of being bent repeatedly without irreversible damage at the desired scale.

During establishment of further contact the contact front advances with an advancement rate that is dependent on the conditions of the system at hand. Such conditions include the force balance at the contact front and therewith the magnitude and direction of the attractive force, the mass of the part of the sheet and/or substrate to be displaced for establishing contact (free part of the sheet as partly determined by its stiffness) and the material properties of the first and second surfaces.

When the sheet is left to be free, as for example the part 120, further contact is established in the advancement direction substantially perpendicular to the direction in which the contact front extends and with a rate equal to the distance over which the contact front advances in this advancement direction per unit time. As explained here before, the advancement rate may be due to amongst others surface properties including relief and adhesive properties of the sheet 106 and/or the substrate 102. When these properties are uniform over the surfaces, the advancement rate will not vary over the surface. However, this condition is often not met in practice.

The method and apparatus for establishing further contact as used in a second embodiment may be advantageously used for counteracting the effects of advancement rates that vary over the first and second surfaces to be contacted with each other.

The second embodiment is described with respect to FIG. 2. This embodiment differs from the first embodiment in that after the establishment of the initial contact the second area is restrained from making further contact by attaching a portion of sheet to a second holder.

Figure 2A:
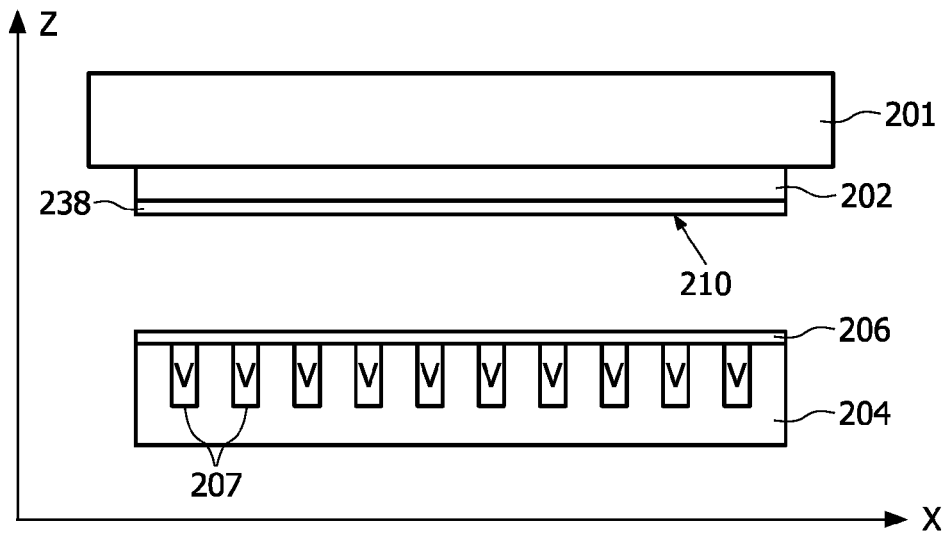
FIGS. 2A to 2F diagrammatically show sectional views not drawn to scale of different stages of a method according to the invention using an apparatus according to the invention comprising a plurality of actuator devices for restraining and releasing the sheet.

FIG. 2A shows a first holder 201 holding a substrate 202, the substrate having a first surface 210. Further shown is a second holder 204 having devices called actuators for restraining (holding) and releasing a sheet 206 held by the second holder 204. To this end the second holder 204 in this example comprises a plurality of spaced-apart pneumatic actuators 207. The apparatus also comprises means for controlling of the actuators in order to let them restrain and/or release the sheet. Such means may comprise gas handling equipment for driving of the actuators as well as one or more microprocessors, user controllable input and display devices and software, which will be further detailed below.

Not shown are parts of the apparatus for positioning the first and second holders using means as for example described in the first embodiment of the application.

Figure 2B:
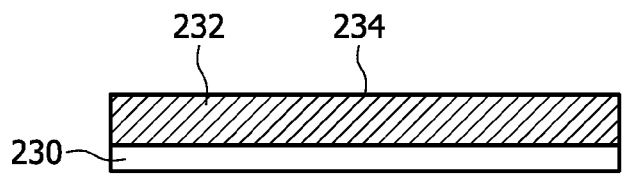
Figure 2C:
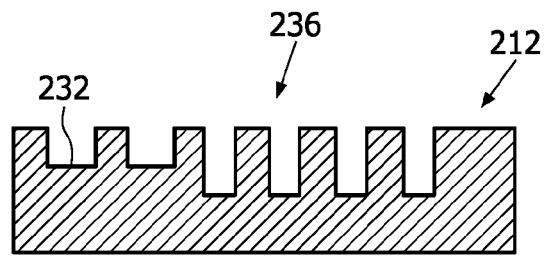

The sheet 206 is flexible and includes a back plate 230 having a stamping layer 232 attached thereto, the stamping layer therewith being supported by the back plate (FIGS. 2B and 2C). The sheet 206 functions as a flexible stamp 206. Portions of the flexible stamp 206 are shown in more detail in FIGS. 2B and 2C, illustrating the fact that the stamping layer 232 includes a stamping surface 234. The stamping surface therewith represents the second surface 212 of the sheet 206. In this embodiment the stamping layer 232 comprises a relief structure such that its stamping surface 234 is a relief surface representing a feature pattern 236. The features of the pattern 236 may be in the micron and submicron range, even in de nanometer range. For example, the dimensions of the features may vary from 15 nm to larger than 1 mm, wherein the aspect ratio (vertical dimensions divided by lateral dimensions) of the features may be higher than 8. The stamping layer 232 in this embodiment is manufactured of a flexible, soft material, such as polydimethylsiloxane (PDMS) rubber.

Other materials or elastomeric material can be used if desired. Exemplary materials are provided in US2004/0261981 A1, WO 2005/101466 A2 or the publications mentioned in the preamble of this application. Note that different sheet materials or substrate materials will have different surface properties which can be chosen according to desire in order to influence the force balance necessary for the advancement of the contact font.

The back plate 230 may comprise glass or another suitable material, such as plastic, aluminium or stainless steel, and is relatively thin, such that the back plate 230 is capable of supporting the stamping layer 232 but is flexible also. For example, the thickness of the back plate 230 may be 150 µm, whereas the thickness of the stamping layer 232 may be 600 µm.

In FIG. 2, the substrate 202, the stamp 206 and the second holder 204 are shown as being applied in a process of liquid embossing. For the purpose of carrying out this process, the substrate 202 is provided with a coating 238 such that the coating forms part of the substrate and the first surface 210 is formed by this coating. The stamp 206 is used for the purpose of making an imprint in the coating 238 by embossing. The embossing process results in a mirror image 236' of the relief pattern 236 in the coating 238.

The wet coating 238 or imprinting layer in this embodiment comprises a sol-gel material according to the non-prepublished European patent application no 06123325.0. However, it is stipulated that a large variety of imprint layer materials can be advantageously used within the method and apparatus. In fact any material that is formable by the stamping surface may be used. These may be curable materials, i.e. materials that after, or during embossing can be hardened by treating them thermally, or with radiation, or which harden through chemical reaction, or through loss of components. The materials advantageously used include photoresists commercially available such as used extensively in semiconductor industry. Exemplary materials are found within US 2004/0261981 A1, WO 2005/101466 A2, US 2005/0230882 A1, US 2004/0264019, advanced materials 1998 10(8) 571.

If appropriate in view of the imprinting material, the apparatus preferably comprises means for providing the curing action. Thus, the apparatus may comprises equipment for providing UV radiation to the imprinting layer 238. Preferably either the sheet or the substrate are at least partly transparent for the curing radiation.

In the present embodiment, the coating is applied to the substrate outside the apparatus using a conventional spin-coating procedure. However, the coating may be applied using other conventional techniques including printing, inkjet printing, laminating techniques such as doctor blade, or LB film deposition. The coating may be applied such as to be comprised by the substrate as in the present embodiment, but it may also be provided such as to be part of the sheet, or of both substrate and sheet. The coating may be provided before mounting of the substrate and/or the sheet in the apparatus, or after. If the coating is applied after mounting, it is advantageous if the apparatus comprising means for applying the coating, such as for example a jet printing device or spincoating equipment. The apparatus thus would exclude the use of external coating application devices and therewith provides increased automated processing.

The coating preferably has a thickness which is in a range between 20 nm to 20 µm. However, if necessary layers of other thicknesses can be used. Those skilled in the art know how to apply layers of different thickness using the different methods for application of the coatings.

In the process of the present embodiment, the stamp 206 is gradually applied to the substrate 206 starting from one end and going to an opposite end of the substrate surface 210 in order to avoid air inclusions and associated distortions of the pattern in the coating 238. The obtained pattern is fixed by allowing the coating 238 to cure or to solidify while the stamp 206 is positioned against the substrate surface 210. After the curing process has taken place, the stamp 206 is peeled off of the substrate 202 leaving a relief layer on the substrate 206.

In the present embodiment, curing proceeds due to removal of solvent from the imprint layer, therewith allowing a solidification process within the layer to proceed to such extent that the layer is practically hardened as in a solid. Further details are provided below.

The process of gradually laying down the stamp 206 on the substrate surface 210 is done using the actuators 207. In a preferred embodiment, each actuator 207 comprises a groove 207 which is extending in the second holder 204 and wherein a gas pressure prevailing in the groove 207 is variable between vacuum and an overpressure. With respect to a width of the grooves 207, it is noted that on the one hand, the groove 207 needs to be wide enough in order not to restrict gas in its flow, and that on the other hand, the groove 207 may not be too wide in order to avoid a situation in which the stamp 206 is pulled in the groove 207 under the influence of atmospheric pressure when the groove 207 is in a vacuum condition. A suitable value of the width of the grooves 207 is 1 mm.

Figure 2D:
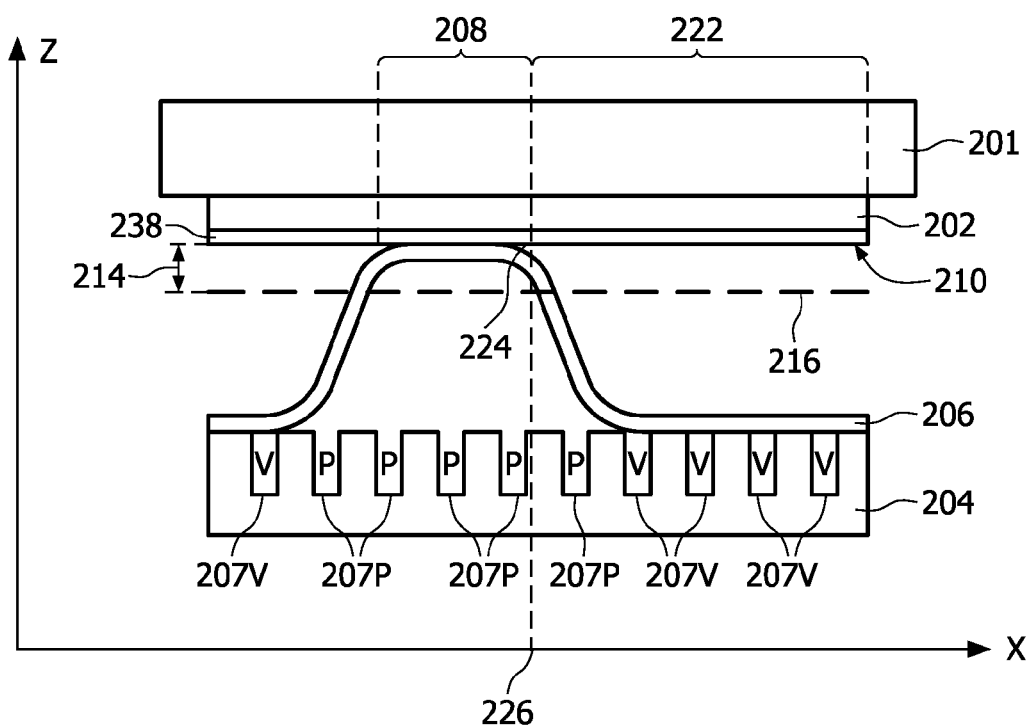
Figure 2E:
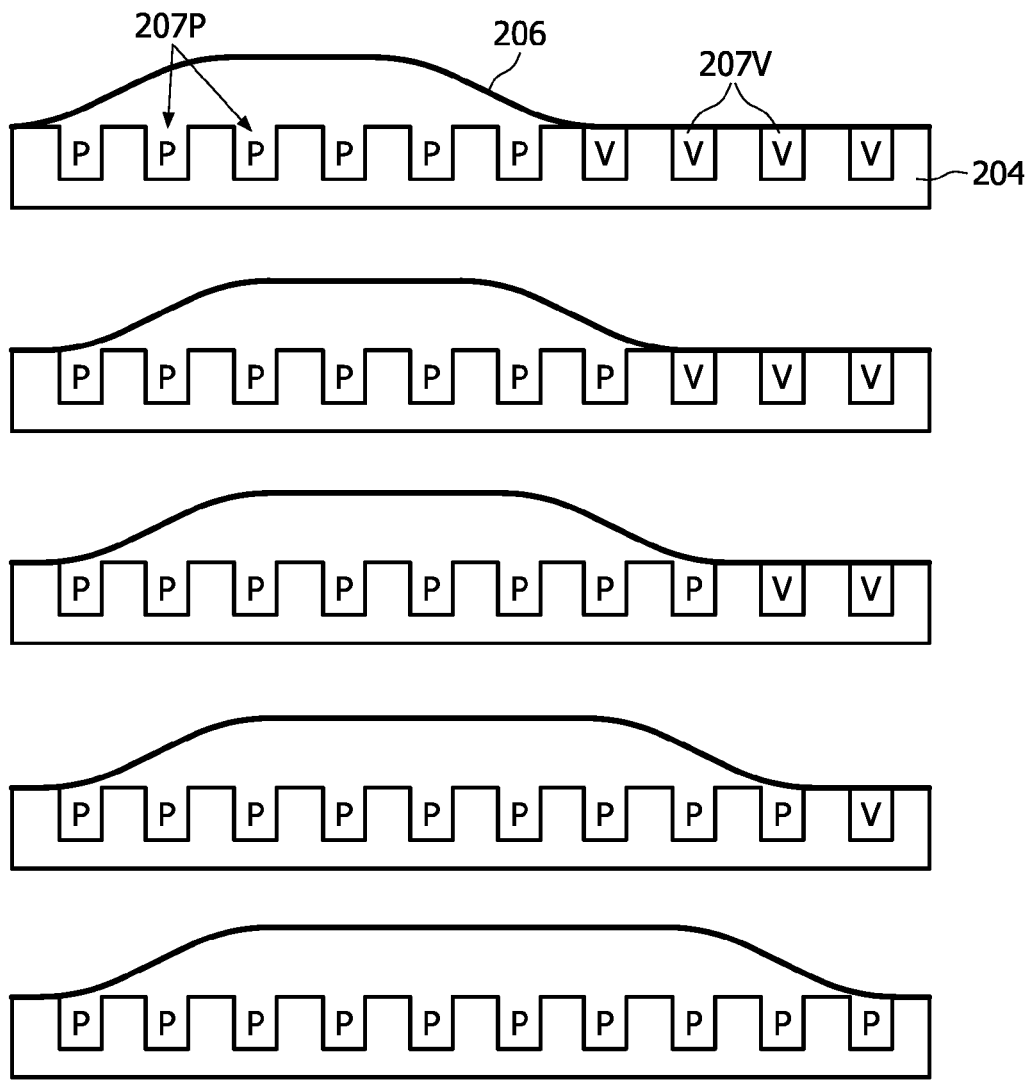

Initially as shown in FIG. 2A, all grooves 207 are in the vacuum condition for the purpose of holding the stamp 206 against the second holder 204, at a certain distance with respect to the first surface of the substrate 202. This is indicated by the letter V in the grooves. The process of applying the stamp 206 to the substrate 204 is started by establishing an initial contact by putting one or more grooves 207p to an overpressure condition (designated by the letter P) at one side of the stamp 206. As a result, a portion of the stamp 206 which was first held by the second holder with the actuated grooves 207 is released from the second holder and displaced towards the substrate 202 until contact between the first surface 210 and a first area 208 of second surface 212 of the stamp 206 is established. The result is shown in FIG. 2D.

Analogously to what has been described for the first embodiment, the initial contact creates a contact front 224 running along the first surface 212 and forming the borderline between the first area 208 and the second are 222. Note however, that in contrast to the first embodiment the second area in this area is withheld or restrained from making further contact by the grooves 207v, which still have vacuum conditions. Furthermore, similarly as in the first embodiment, there will exist a region close to the contact front 224 wherein the first distance between the second surface 212 of the stamp 206 and the first surface 210 of the substrate 202 is smaller than the threshold distance 214 such that the conditions for establishment of further contact are fulfilled. In the present embodiment, the attractive force is then provided by surface adhesion forces operating between the stamp surface 234 and the first surface 210 of the coating 238.

Subsequently, to establish further contact, grooves 207v adjacent to grooves 207p are pressurized sequentially to release portions of the restrained part of the sheet 206. The sequential release is detailed in the five stages depicted in FIG. 2E. Each next stage depicted is realized by switching a groove 207v, which is located next to a groove 207p that has just switched from the vacuum condition to the overpressure condition, from the vacuum condition to the overpressure condition as well. As a result of the sequential release, the contact front 218 displaces along the first surface 210 in the direction of the second area 222. In this case in the positive X direction. The final situation is that depicted in FIG. 2F, wherein the contact front has advanced over a distance 228 along the X direction towards its new X position 226'.

In FIG. 2 a vacuum condition of the grooves 207 is indicated by a letter V, and that an overpressure condition of the grooves 207p is indicated by a letter P. In the overpressure condition, a pressure in a range of 5-100 mbar, for example, may be exerted on the stamp 206.

The overpressure is not used for pressing the stamp 206 against the surface 210 of the substrate 202. On the contrary, it is the attractive force that establishes the further contact. The pressure is used to provide convenient release from the second holder without pressure fluctuations influencing motion of a released part or free part of the stamp 206. This is further elucidated below with reference to FIGS. 3A to 3B.

Figure 2F:
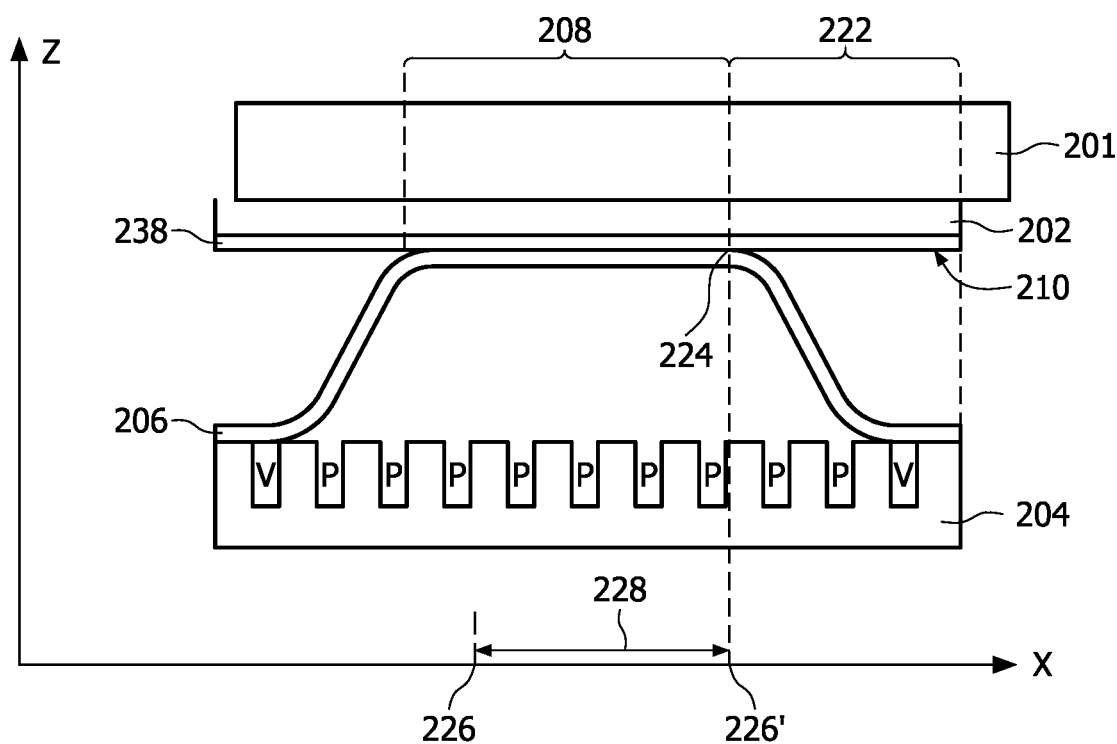
Figure 3A:
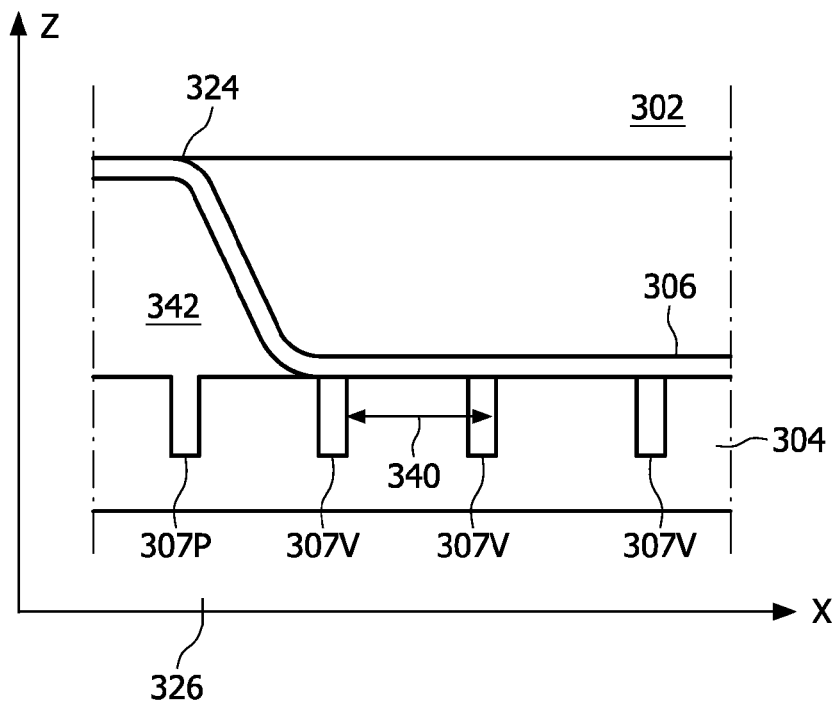
FIGS. 3A to 3C diagrammatically shows the process of making distortion less contact according to the invention.
Figure 3B:
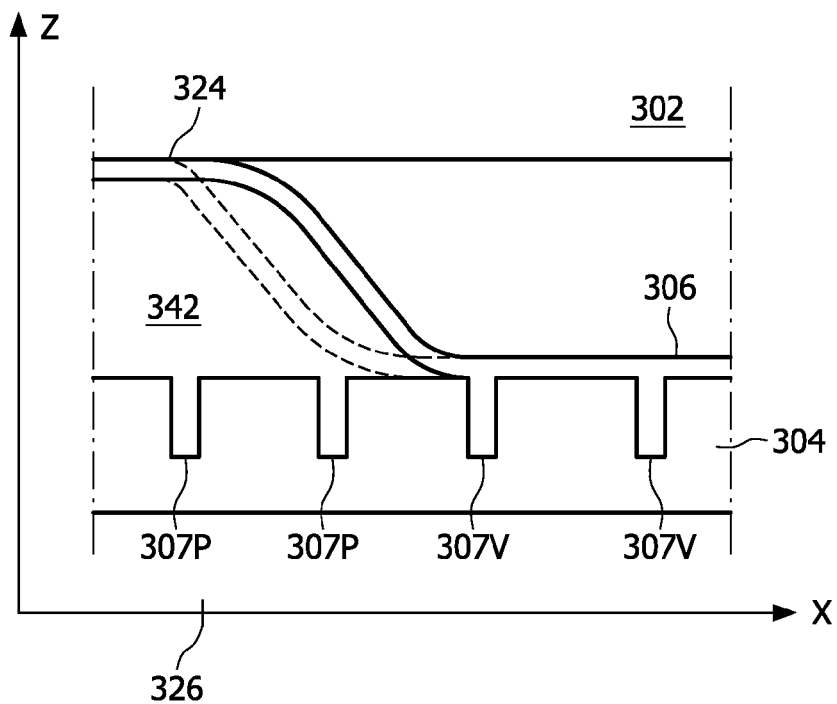
Figure 3C:
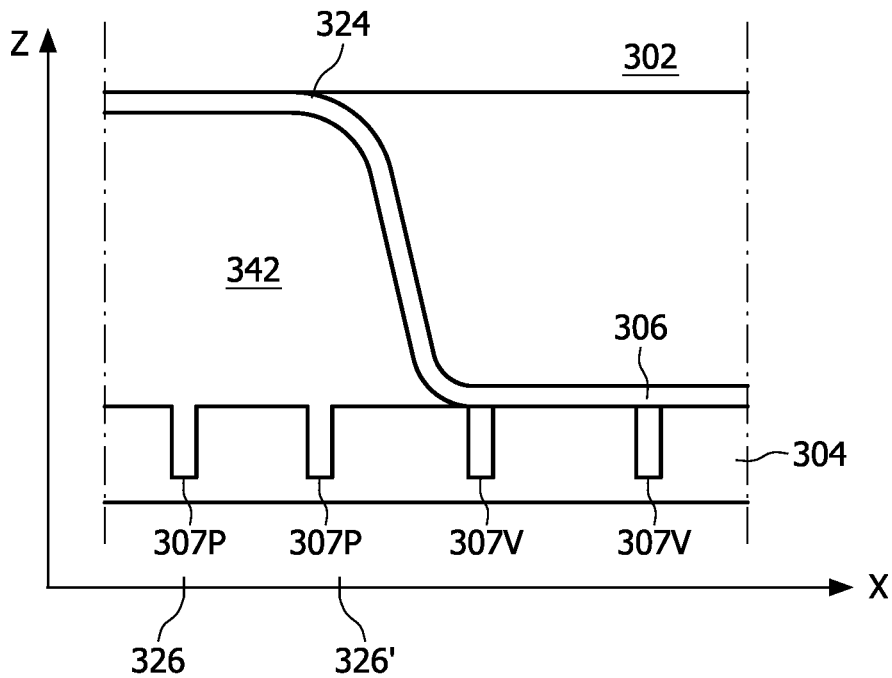

FIG. 3A shows a detailed portion of FIG. 2F at some point in time t during the process of establishing further contact of sheet 306 to substrate 302. going from the situation of FIG. 3A to FIG. 3B, a portion of the sheet 306 is released from the second holder by putting one actuator nozzle or groove from vacuum to an overpressure. Immediately following this action, the free part (the part spanning the distance from substrate 302 to second holder 304) of the sheet 306 relaxes to some extent. When the overpressure is absent or low, the shape of this free part would be according to the dashed line in FIG. 3B. For example gravity would cause such hanging. As the ratio of the pitch 340 of successive vacuum nozzles over the distance between the substrate 302 and the second holder 304 is generally a factor of 10 or higher, there is the risk of premature attachment of the free part by vibrations, or by pressure variations in the cavity 342 induced by the gas pressure switching of the nozzle. This is counteracted by using an increased overpressure so that the shape of the free part of the sheet 306 just after release is according to the solid line in FIG. 3B. Note that this reshaping does not accomplish establishment of further contact due to the relaxed condition of the sheet. Instead, advantageously, near the contact front 318 bending or deformation of the sheet is reduced. Some instant later after immediate relaxation of the sheet, the attractive force establishes the further contact as described here before to result in the situation as depicted in FIG. 3C. The contact front shifts from X-position 326 to 326'.

Alternatively the situation in FIG. 3A one could turn the arrangement upside down, such that the described hanging would lead to the desired shape of the sheet in the relaxed state without having to apply the slight overpressure. However, as will be further detailed below, it may prove advantageous to apply the overpressure in order to prevent vibrations of the free part of the sheet also in this alternative orientation.

Due to the process explained with respect to FIGS. 3A to 3C, there are substantially no strain forces acting on released portions of the stamp for fixing these portions at certain positions on the substrate the stamp is allowed to follow its own natural course. Therefore, it is achieved that the stamp is applied to the substrate in a stress-free manner. A portion of the stamp 206 or 306 which is bridging the distance between the second holder 204 or 304 and the substrate 202 or 203 may be strained such as for example in FIG. 2A or 3A, but when the contact front advances, any free portion of the stamp 206 or 306 which comes into contact with the corresponding substrate is relaxed and allowed to settle itself with respect to the portion of the stamp which is already in contact with the substrate and the stress is released from this portion. Capillary forces which are acting on the stamp due to the presence of the wet coating contribute to a smooth progress of the process of gradually establishing contact between the stamp and the substrate.

The actuators 207 are also used for peeling off the stamp 206 in a controlled manner of the substrate 202, once the wet coating 238 has hardened through curing and there is no risk of the features imprinted in the coating 238 being deformed when the stamp 206 is removed. In the above-described embodiment of the actuators 207, in which the actuators 31 are pneumatic actuators being shaped like grooves 207, the stamp 206 is peeled off by successively switching the grooves 207 from the overpressure condition to the vacuum condition. In the process, the stamp 206 gradually moves towards the second holder 204. In practice, the process of peeling off the stamp 20 of the substrate 202 may be performed at a speed of at least 0.25 cm/s.

In alternative embodiments of the method other ways for peeling of may be used, either using the apparatus or outside the apparatus using different tools.

Preferably, a pitch of the grooves 207 is smaller than 5 mm, or even smaller than 2.5 mm. Tests which have been performed in respect of the present invention have shown that if the pitch is chosen to be larger, air inclusions are formed between the stamp 206 and the substrate 202. It has been found that this formation of air inclusions may be explained as follows. When a groove 207 is switched from the vacuum condition to the overpressure condition, the release of a portion of the stamp 206 which is associated with the groove 207 takes place at a pressure which is lower than the pressure prevailing under the portion of the stamp 207 which is already in contact with the substrate 202. As a result, pressure fluctuations are obtained, under the influence of which the free portion of the stamp 206 which is bridging the distance between the second holder 204 and the substrate 202 starts to vibrate. A practical value of the distance between the stamp 206 and the substrate 202 is very small, for example about 100 μm, while the bridging free portion of the stamp 206 has a width in an order of millimeters.

Therefore, a very low aspect ratio is applicable, and the stamp 206 is apt to contact the substrate 202 ahead of a steadily advancing contact front as a result of the vibrations. Once such unintended contact is made, the attractive force pulls the stamp 206 further into the wet coating and air inclusions are obtained.

Each time the stamp 206 is released from a next groove 207, the contact front 224 moves further. The distance that is covered by the contact front 224 under the influence of the attractive force is about 1-2 mm. When a situation in which contact is obtained ahead of the contact front 224 is avoided, the formation of air inclusions is avoided as well, as the progressing contact front 224 pushes the air in front of it. Hence, when the groove pitch is chosen such as to be in an order of 1-2 mm, entrapment of air does not occur.

The contact of the stamp 206 to the substrate 202 is established in a discontinuous, stepwise fashion, as the contact front 224 advances every time a groove 207 is switched from the vacuum condition to the overpressure condition. The distance of one step in the process of establishing further contact between the stamp 206 and the substrate 202 equals the groove pitch. On the one hand, air inclusions may be avoided by choosing the groove pitch such as to correspond to the distance that is covered when the contact naturally advances under the influence of the capillary force. On the other hand, air inclusions may be avoided by matching the speed at which the stamp 206 is released with the speed at which the capillary contact line advances. In this way, it is achieved that the contact line never stops, and that the stamp 206 is placed smoothly on the substrate 202. The speed at which the stamp is released is determined by the groove pitch and a time interval with which successive grooves 307 are switched from the vacuum condition to the overpressure condition. In order to avoid air inclusions, it is preferred to have a time interval that is at least equal to a quotient of the groove pitch and the speed at which the capillary contact line advances. Practical values of the speed at which the stamp 206 is released may be about 1 cm/s in case of a relatively thin wet coating and about 0.25 cm/s in case of a relatively thick wet coating.

When a process of liquid embossing is performed under the conditions of the second embodiment, i.e. by using a second holder 204 having grooves 207 which are switchable between a vacuum condition and an overpressure condition, and which are extending at a mutual distance in a range of 1-2 mm, by using a stamp 206 having a stamping PDMS rubber stamping layer 232 and a glass back plate 230 of which a thickness is in an order of 100 μm, wherein dimensions of features of a stamping surface 234 of the stamp 206 are in a range of 15 nm to larger than 1 mm, by positioning the stamp 206 at a distance of about 100 μm with respect to the substrate 202, by using and imprinting a wet coating 238 comprising sol-gel according to the non-pre-published European patent application no 06123325.0, and by releasing the stamp 206 at a speed in a range of 0.25-1 cm/s, while applying a pressure in a range of 5-100 mbar to the vacuum nozzles, it is possible to use wafers such as 6-inch wafers as the substrate 202, and a stamp 206 which is large enough for covering the wafers, so that it is possible to achieve a throughput that is high enough for the process to be commercially applicable in for example semiconductor industry. Results obtained using the procedure described are provided in FIGS. 6A to 6D showing SEM pictures of: a grating of 16 nm wide elevated siliconoxide lines, in a 150 nm pitch (FIG. 6A); a grating of 30 nm wide 80 nm high silicon oxide lines, in a pitch of 200 nm (FIG. 6B); an array of 60 nm wide and 100 nm deep recesses in a siliconoxide layer the array pitch being 200 nm (FIG. 6C); and an array of siliconoxide spikes each having a height:width=930 nm:178 nm. The time for releasing subsequent portions of the restrained sheet may be used to define a release rate of the sheet. As explained here before control over the release rate is advantageous in preventing air inclusion. However, other advantages are apparent from FIGS. 4A to 4C and the description here below.

The advancement rate of the contact front is defined as the distance of advancement per time unit and is determined by properties of the system at hand as described here before. The release rate is defined as a certain length of restrained sheet that is released per unit time, where the length is measured in a direction substantially perpendicular to the contact front. For example in the second embodiment the release rate is the pitch 340 defined by the time Δt between operation of successive nozzles 307 in FIG. 3A.

It will be clear that the advancement as determined by the properties of any system is a continuous process. Although theoretically this could also hold for the release of the sheet, in the second embodiment the release is a discontinuous process as provided by the design of the second holder having a plurality of actuators that are sequentially operated. Nevertheless, it will be clear that proper design of the apparatus could provide for a continuous release of the sheet. For example a continuously displacing (electro)magnet could be used for releasing the sheet.

Figure 4A:
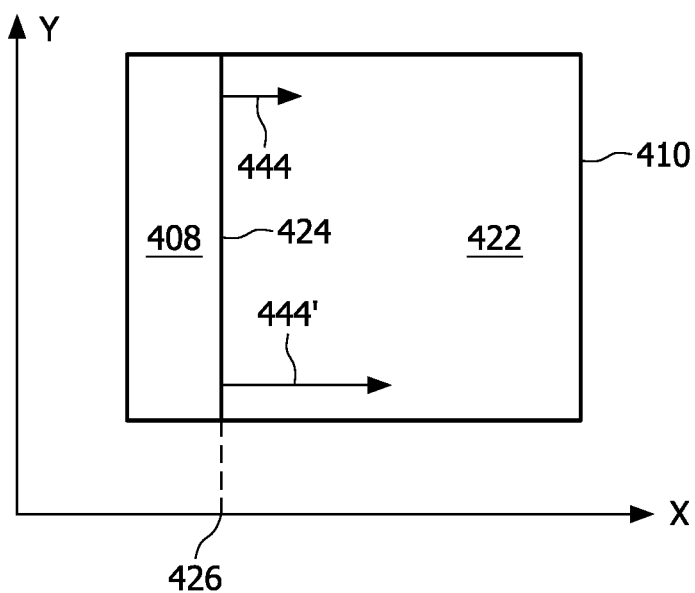
FIGS. 4A to 4C diagrammatically show the principle of the control of contact front advancement.
Figure 4B:
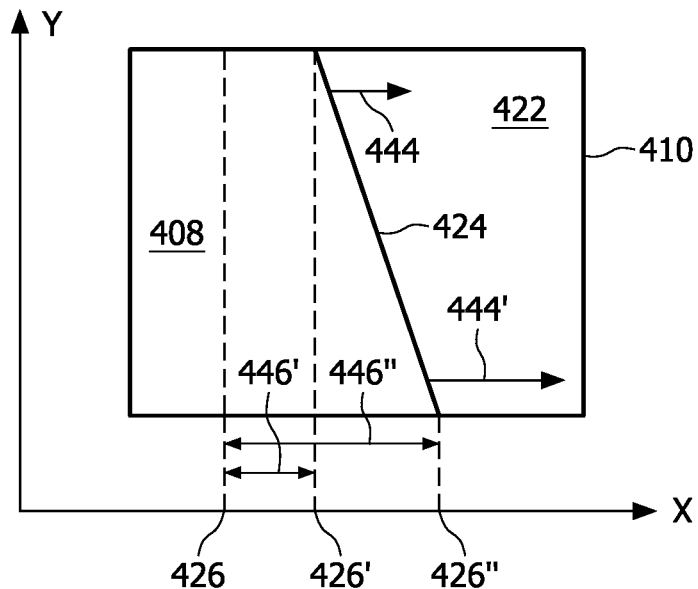

Thus, in the second embodiment the rate with which further contact is established is controlled by the release rate through choosing the release rate to be lower than the advancement rate. This control of the advancement rate is advantageous when the advancement rate is not identical along the contact front. FIG. 4A represents a top view of establishment of further contact at time t, wherein a surface 410 of a substrate 402 having a contact front 418 dividing a second area 422 from a first area 408 is shown. A first advancement rate 444 on one end of the contact front is lower than a second advancement rate 444' at the other end (the rate is represented by the lengths of the arrows). An advancement period Δt later the situation has evolved into one as represented by FIG. 4B when the advancement rate is not controlled by the release rate, i.e. the release rate is higher than the highest advancement rate (possible air inclusions are not taken into account here). The contact front has advanced non equal distances 446' and 446" from the starting X-position 426 at time t, rendering the contact front 424 to be oblique with respect to the starting situation at time t. This can cause stress and deformation in the sheet.

By adjusting the release rate to a value lower than, or equal to the lowest advancement rate these effects are eliminated. For example the release rate at all Y-positions is made equal to the lowest advancement rate 444, preventing advancement faster than with a rate of 444. The result is that in the same advancement period Δt, the contact front 424 has advanced only to position 426', but is not oblique. Moreover, the contact front has never been oblique during the entire process of establishing further contact. Alternatively, the advancement rate is controlled by giving the release rate a value in between the fastest and slowest advancement rate, i.e. in between the value 444 and 444'. In that case after an advancement period Δt the contact front is bent, the oblique part of the contact front not being able to catch up with the release.

Figure 4C:
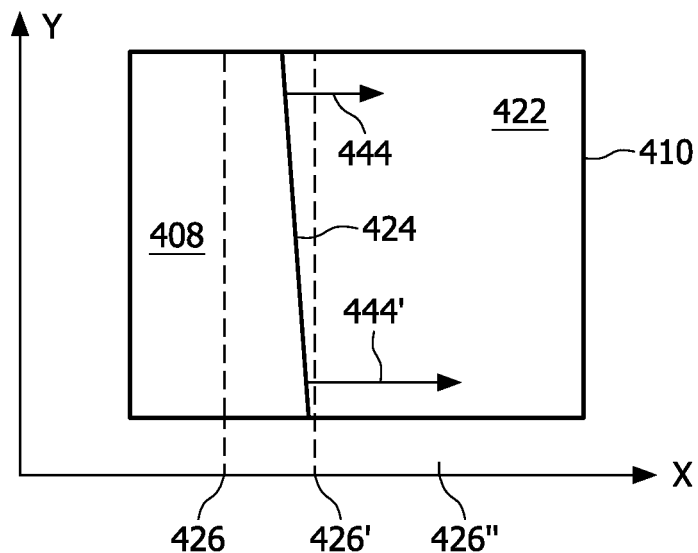

A discontinuous release process may provide additional advantages in this respect. In a discontinuous process one has the opportunity of allowing the advancing contact front to catch up after releasing of a portion of the sheet. Therewith obliqueness of the contact front is reduced to a limited amount that may be tolerated in terms of stress or deformation. The result is that during establishment of further contact an oblique and bent contact front occurs, but that after a long enough catch-up period the contact front becomes straight again. If the released portions are small enough, a situation may be created wherein a tolerable amount of deformation of the contact front in terms of stress occurs. In detail, after releasing a portion of the sheet with length 450, which length is half the distance which the fastest part of the contact front would have advanced in a time Δt, during the subsequent advancement period 1/2Δt, the contact front 418 will have advanced as depicted in FIG. 4C. Note that obliqueness is half that depicted in FIG. 4B. In a subsequent period 1/2Δt, which is the catch-up period, the slower part of the contact front catches up to form the straight contact front at position 426'. Then this cycle is repeated by releasing another portion of the sheet, eventually resulting in the contact front to have advanced to the position 426" in a time duration of 2Δt. Thus in the same time duration, the contact front advances the same distance but with less obliqueness as compared to the non restricted advancement.

In an alternative process for controlling the release, during further contact, the shape of the lateral released area can be controlled. Thus, a released portion may be chosen as having borders parallel to the contact front 224. If the actuators are distribute over the holder area the actuation scheme may therefore be altered.

It will be appreciated that when other distributions of advancement rates along the contact front occur that result in bent or crooked contact fronts during advancement, a similar strategy of restraining in combination with release speed control may be advantageously used to reduce the effects.

It may prove impractical to calculate the advancement rate from the system used. In a practical embodiment of any implementation of the invention, a test run is used to determine the advancement rate (distribution). The results can be used to set or control the release rate. In obtaining the results of FIG. 6 for example a test run was performed and the advancement rate measured. In a subsequent run the advancement rate was controlled in the runs for obtaining the results.

In a preferred embodiment, an apparatus and method according to the invention allow that the advancement rate is actually measured, or determined during establishment of further contact in a real production run. The values obtained are subsequently used to control the advancement rate using a feedback mechanism, therewith providing accurate control over the contact front shape using the procedures described here before. Therewith accurate real time control is obtained over stress and deformation. This advantageously allows automated processing.

Figure 7A:
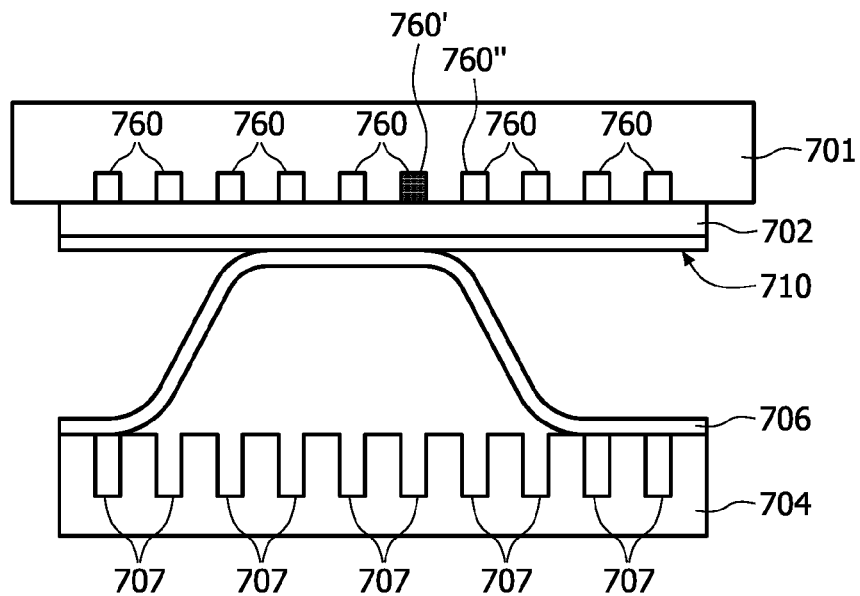
FIGS. 7A and 7B provide a schematic build up of an apparatus according to the invention comprising sensors.
Figure 7B:
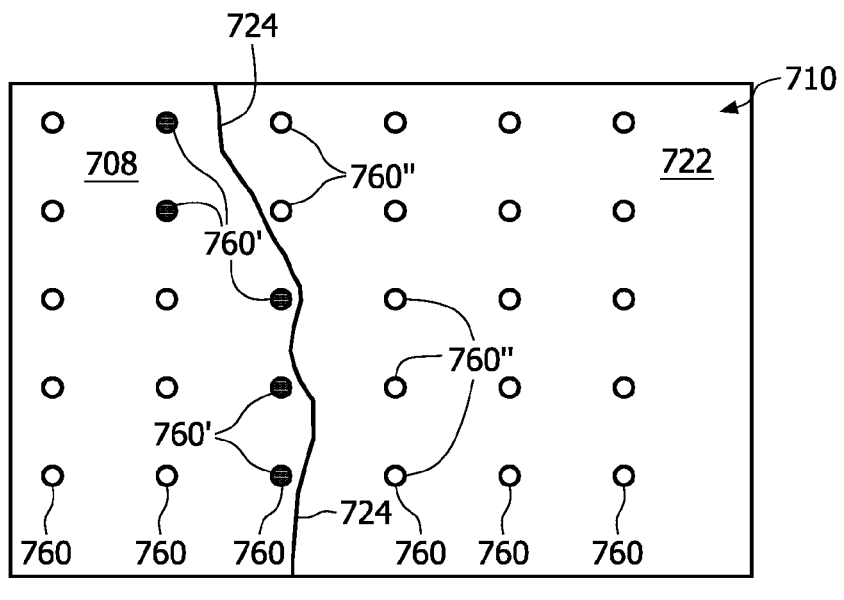

Thus, an apparatus according to such an embodiment as exemplified in FIG. 7 besides the first holder 701, holding a substrate 702 and a second holder 704 holding a sheet 706 comprises the means for determining the advancement rate at one or more positions along the contact front at one or more points in time during establishment of further contact. Such means for example may include sensors 760 for determining the position of different portions of the contact front in time. The sensors may include mechanical sensors such as pressure sensors, or (electro)magnetic sensors reacting on inductance or reactance changes such as capacitors, resistors or coils, or electromechanical sensors such as piezoelectric sensors, or optical sensors. Preferably multiple sensors 760 are used that are distributed such that they cover different portions of the first area 710, the second area or both. Together they at least sense the relevant area for controlling the process of establishment of further contact. The sensors may be user adjustable or repositionable across the surfaces. The sensors may be part of the first and second holders. Thus, when a contact front 724 advances in the X-direction, the sensors 760' indicate passing of the contact front while the sensors 760" do not. There from a first shape and position of the contact front 724 can be determined. By repeating the measurement some time later different sensors indicate a second position and shape of the contact front 724. relating the translational positions of the contact front to the passed time between measurements results in the advancement rate of the contact front to be known.

The apparatus preferably further comprises the means for processing the sensed signals into actuator signals to drive the actuators 707. Preferably user defined input is also taken into account via an input terminal, user interface or the like. The whole process and apparatus is controlled by software stored within a data carrying device. The software being capable of providing control for a method according to the invention to be carried out by the apparatus in question. For example the software is such that the user is allowed to provide input regarding for example a maximum amount of allowable distortion of the contact front or for allowing a maximum advancement rate. Alternatively the system may adjust its release according to the actual measurements without user interference.

The system is then preferably set up such that the sensor signals representing the advancement rate are transformed into actuator signals with the appropriate timing and position for defining a release and release rate according tot the advancement rate and the user input.

Figure 5:
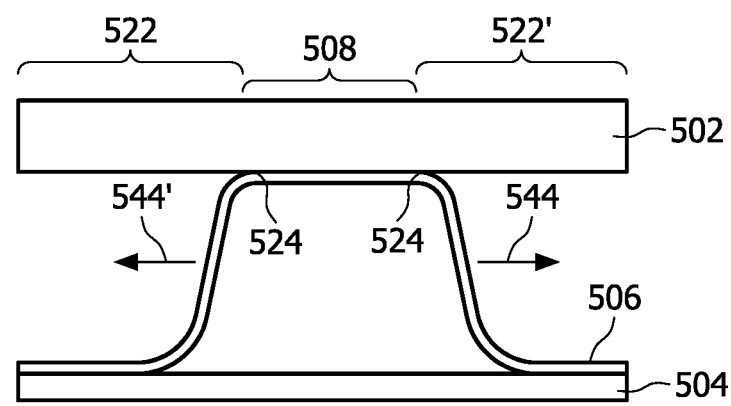
FIG. 5 provides an example of multiple independent contact front advancement.
Figure 6A:
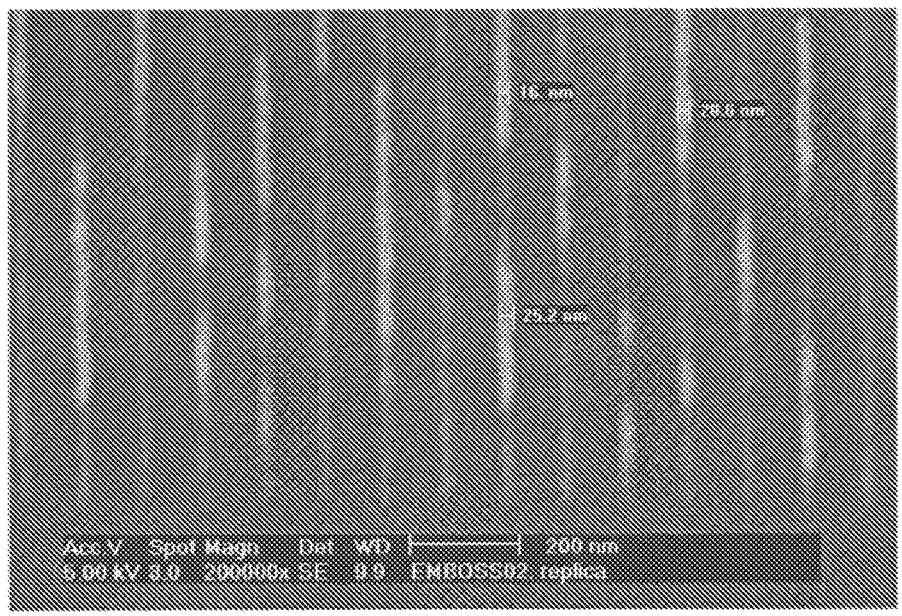
FIGS. 6A to 6D show results obtained using the method and an apparatus according to the invention.
Figure 6B:
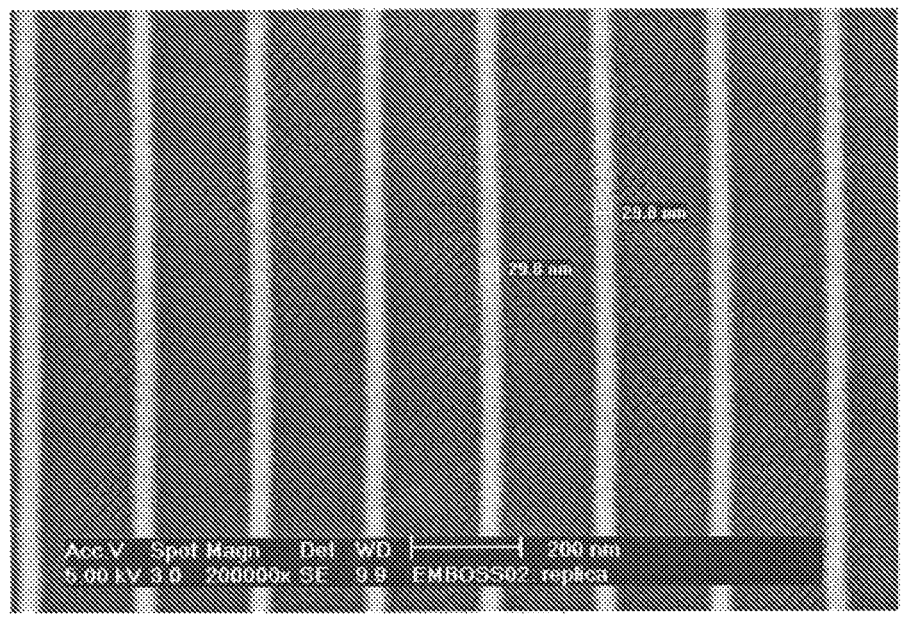
Figure 6C:
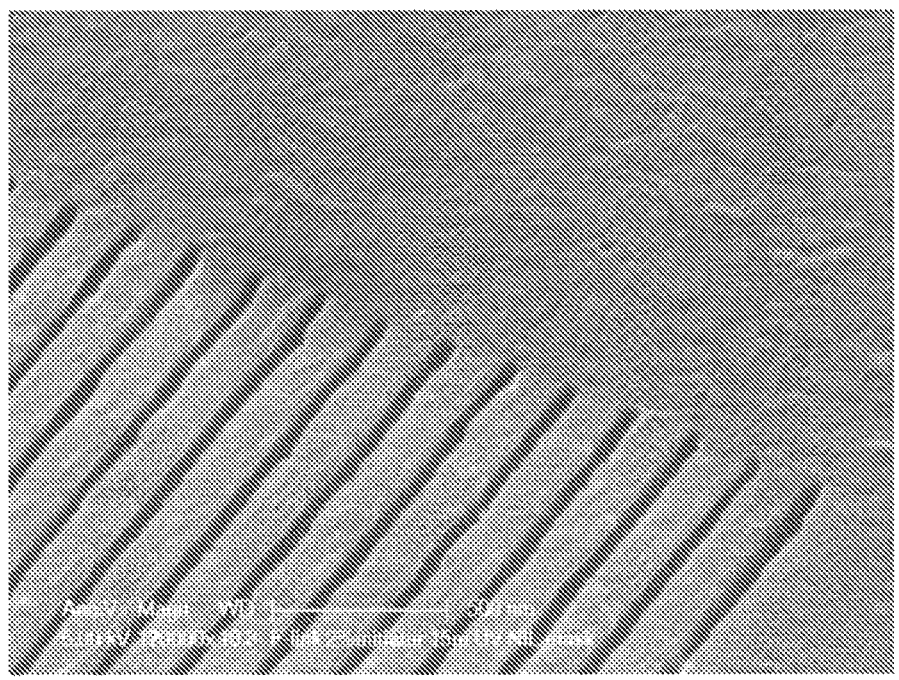
Figure 6D:
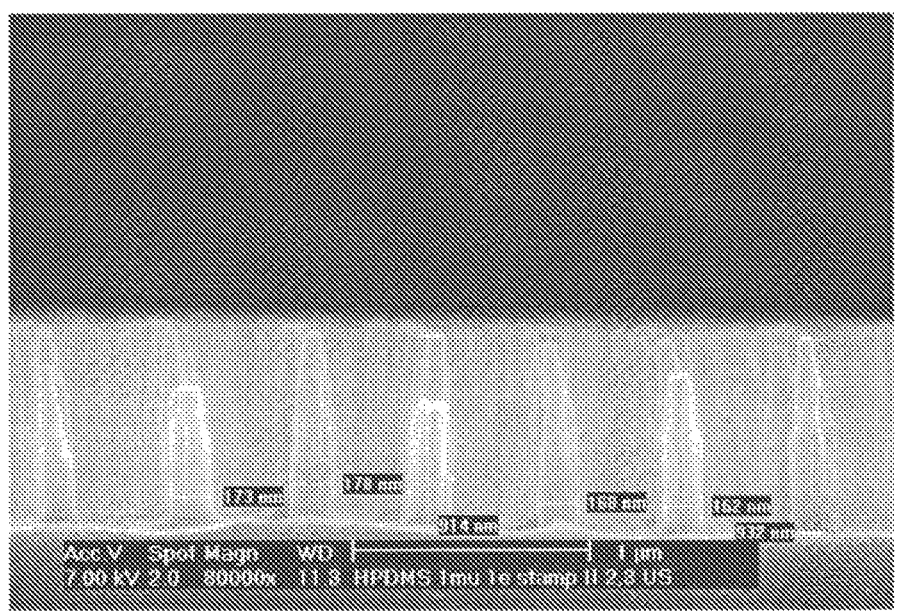

In an embodiment the contact front may have a shape according to desire. Thus in FIG. 3 the contact front is for example linear and moves from left to right along the X direction. In another embodiment the initial contact has been established such that two contact fronts exist that advance in different directions. Therewith a saving of time during establishment of further contact is obtained, which may be especially advantageous when advancement rates are low. An example of such an embodiment is shown in FIG. 5. Two contact fronts 524 and 524' advance in opposite X directions. The further contact is established such that the first area 508 grows on two sides at the expense of both second areas 522 and 522'. Depending on the conditions at each contact front the advancement rates may be equal or different. It will be appreciated by those skilled in the art that advancement rate control mechanisms as described here before may be provided for each and every advancing contact front. In another embodiment, the contact front is a closed front. It can for example be a circular contact front.

The method of the invention is versatile with respect to the orientation in space of the substrate and sheet. Thus, the orientation may be chosen as shown in FIGS. 1 and 2, such that the flexible sheet is displaced against the force of gravity. It has proven possible to construct the apparatus such that the method is performed in a way that the sheet is laid down on the substrate In such an embodiment, restraining of the sheet is necessary for preventing the sheet from falling on top of the substrate surface. The invention provides a very convenient way of restraining or holding the sheet as well as for establishing further contact. The attractive force provides the force for establishing contact. No external devices such as pressing members that slide along the sheet during laying down of the sheet on the substrate therewith resulting in unwanted shear forces that cause stress in the sheet are necessary. Moving parts are reduced to a minimum being the free part of the sheet.

The present invention has been described in the context of a process of liquid embossing, but that does not alter the fact that the present invention may be applied in the context of other processes. For example, the way in which the stamp 206 is gradually released from the second holder 204 and applied to the substrate 202 may also yield advantageous results in a context of micro contact printing, as in such a case, it is also important to avoid distortions of the pattern to be transferred by avoiding the introduction of stress in the stamp 206. In the case of micro contact printing, despite of the absence of a wet coating 238, it is still possible to allow the stamp 206 to follow its own natural course while being applied to the substrate 202, as the presence of fluid between the stamp 206 and the substrate 202 does not constitute a necessity.

It is noted that in the process of micro contact printing, the risk of the formation of air inclusions is considerably smaller, as due to the absence of fluid, air may escape between the features of the pattern to be transferred.

Another example of a field in which the present invention may be applied is the field of phase-shift mask technology. The sheet may then be used as a surface relief compliant mask directly. Alternatively, a layer of the substrate is patterned using the method of the invention therewith providing a patterned layer to the substrate that can serve as a mask during lithographic processing.

In general, it is also possible that material is applied to the stamp, and that this material is transferred from the stamp to the substrate when the stamp and the material which is present thereon contact the substrate.

In an embodiment, the method is used to laminate a sheet to a substrate. For example the sheet may be a thinned down semiconductor substrate such as a silicon wafer that is laminated to another semiconductor substrate. The goal of this process may for example be wafer bonding. The stress free lamination is amongst others of importance with respect to correct overlay on/or alignment of features on the substrate and those present on the sheet such that mutual electrical contact is adequately established.

Summarizing, the invention provides a method and apparatus for laminating a sheet to a substrate in a stress free and distortion-less manner. The method comprises providing the sheet and substrate such that an attractive force between them exists that is capable of bringing the sheet and surface together at least when their distance is shorter than a critical distance. The method creates these conditions by locally making an initial contact between the sheet and substrate such that at a contact front, being the boundary between areas where the substrate and sheet are in contact and those where they are not in contact, these conditions exist. In a further step the sheet and substrate are allowed to gradually make contact such that the contact front advances along either of the substrate or sheet surface therewith increasing the contacting area between the substrate and the sheet. The method is advantages when used during imprint lithography or embossing processes or other processes where feature patterns need to be transferred from the substrate to the surface or vice versa.

It will be clear to a person skilled in the art that the scope of the present invention is not limited to the examples discussed in the foregoing, but that several amendments and modifications thereof are possible without deviating from the scope of the present invention as defined in the attached claims. While the present invention has been illustrated and described in detail in the figures and the description, such illustration and description are to be considered illustrative or exemplary only, and not restrictive. The present invention is not limited to the disclosed embodiments. Thus the actuators may be provided to a second holder as in the first embodiment, which enables to establish the first contact in the way it is described for the first embodiment, but allows to use the restraining advantages as described for the second embodiment.

Other variations to the disclosed embodiment can be understood and effected by a person skilled in the art in practicing the claimed invention, from a study of the figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope of the present invention.

The invention claimed is:

1. A method for establishing contact between a first surface of a substrate and a second surface of a sheet, the method comprising:
  providing the substrate and the sheet;
  providing an attractive force between the substrate and the sheet, wherein the attractive force is a surface force operating between the first surface and the second surface, and the attractive force actively brings at least part of the first surface and the second surface towards each other when a first distance between the at least part of the first surface and the second surface is smaller than a threshold distance;
  establishing initial contact between the first surface and a first area of the second surface while preventing the establishment of a further contact between the first surface and a second area of the second surface, whereby the first area and the second area are separated by a contact front; and establishing a further contact by allowing the contact front to advance along the first surface in the direction of the second area such that the advancement of the contact front is caused by the attractive force.

2. The method according to claim 1, wherein before establishing further contact, at least one of the substrate and the flexible sheet comprises a fluid such that a part of at least one of the first surface and the second surface is being provided by the fluid.

3. The method according to claim 2, wherein the fluid forms a contact angle of at most 90 degrees with at least one of the first surface and the second surface.

4. The method according to claim 1, wherein the initial contact is established such that at least two independent contact fronts are formed defining at least two independent second areas and that during the establishment of further contact the at least two contact fronts advance in the direction of the corresponding second area.

5. The method according to claim 1, further comprising:
preventing the second area from making contact with the substrate surface comprises restraining at least a part of the second area from making contact with the first surface, therewith preventing the contact front to advance after establishing initial contact, and;
releasing a portion of the restrained part of the second area to allow the contact front to advance.

6. The method according to claim 5, wherein the contact front advances with the advancement rate over at least a part of the released part of the second area, and the second area is released with a release rate, the release rate being smaller than the advancement rate.

7. The method according to claim 6, wherein the advancement rate is measured and the result is used to set the release rate.

8. The method according to claim 5, wherein during establishment of further contact, the advancement rate is measured at least once and the measured advancement rate value is used to adjust the release rate.

9. The method according to claim 1, wherein the sheet comprises a template pattern for transferring to the substrate.

10. The method according to claim 9, wherein the template pattern is transferred to the substrate using a photolithographic process.

11. The method according to claim 9, wherein the template pattern comprises a relief surface and the template pattern is transferred to the substrate using an embossing process.

12. The method according to claim 9, wherein after transferring of the template pattern to the substrate, the template pattern is detached from the substrate.

13. An apparatus for establishing a contact between a first surface of a substrate and a second surface of a sheet, the apparatus comprising:
a first holder for holding the substrate;
a second holder for holding at least a first part of the first area of the flexible sheet;
means between the first surface and the second surface for producing an attractive force between the substrate and the sheet, the attractive force actively bringing at least part of the first surface and the second surface towards each other when a first distance between the at least part of the first surface and the second surface is smaller than a threshold distance; and
contacting means for establishing an initial contact between the first surface and the first area of the second surface while preventing the establishment of a further contact between the first surface and the second area of the second surface, whereby the first area and the second area are separated by a contact front, wherein a further contact is established by allowing the contact front to advance along the first surface in the direction of the second area such that the advancement of the contact front is caused by the attractive force.

14. The apparatus according to claim 13, further comprising controlling means for controlling the advancement rate.

15. The apparatus according to claim 14, wherein the controlling means comprise restraining and releasing means for restraining and releasing at least a part of the second area of the second surface.

16. The apparatus according to claim 15, wherein the controlling means further comprise measuring means for measuring the advancement rate.

17. The apparatus according to claim 16 wherein the controlling means further comprise a regulating unit, the regulating unit being capable of adjusting the release rate according to a measured advancement rate.

18. The apparatus according to claim 15, wherein the restraining and releasing means include a plurality of spaced apart devices, each device being capable of restraining and releasing a portion of the second area of the sheet, the largest distance between two neighboring spaced apart devices being at most 5 mm.

19. An apparatus for establishing a contact between a first surface of a substrate and a second surface of a sheet, the apparatus comprising:
a first holder for holding the substrate;
a second holder for holding at least a first part of the first area of the flexible sheet;
a fluid between the first surface and the second surface for providing an attractive force between the substrate and the sheet, the attractive force actively bringing at least part of the first surface and the second surface towards each other when a first distance between the at least part of the first surface and the second surface is smaller than a threshold distance; and
an actuator for establishing an initial contact between the first surface and the first area of the second surface while preventing the establishment of a further contact between the first surface and the second area of the second surface, whereby the first area and the second area are separated by a contact front, wherein a further contact is established by allowing the contact front to advance along the first surface in the direction of the second area such that the advancement of the contact front is caused by the attractive force.

20. The apparatus according to claim 19, wherein the actuator is further configured to control the advancement rate.

21. The apparatus according to claim 20, wherein the actuator is further configured to restrain and release at least a part of the second area of the second surface.

22. The apparatus according to claim 21, further comprising a sensor to measure the advancement rate.

23. The apparatus according to claim 22, further comprising a processor configured to adjust the release rate according to a measured advancement rate.

24. The apparatus according to claim 21, wherein the actuator comprises a plurality of spaced apart devices, each device being configure to restrain and release a portion of the second area of the sheet, the largest distance between two neighboring spaced apart devices being at most 5 mm.

* * * * *